(12) United States Patent
Zhu et al.

(10) Patent No.: US 10,447,207 B2
(45) Date of Patent: Oct. 15, 2019

(54) SWITCH WITH ENVELOPE INJECTION

(71) Applicant: Skyworks Solutions, Inc., Woburn, MA (US)

(72) Inventors: Yu Zhu, Wellesley, MA (US); Oleksiy Klimashov, Burlington, MA (US); Hailing Wang, Acton, MA (US); Dylan Charles Bartle, Arlington, MA (US); Paul T. DiCarlo, Marlborough, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 23 days.

(21) Appl. No.: 15/670,434

(22) Filed: Aug. 7, 2017

(65) Prior Publication Data

US 2018/0041204 A1     Feb. 8, 2018

Related U.S. Application Data

(60) Provisional application No. 62/372,198, filed on Aug. 8, 2016.

(51) Int. Cl.
*H03F 1/02* (2006.01)
*H03F 1/22* (2006.01)
(Continued)

(52) U.S. Cl.
CPC .......... *H03F 1/0222* (2013.01); *G10H 1/057* (2013.01); *H03F 1/22* (2013.01); *H03F 3/193* (2013.01); *H03F 3/2171* (2013.01); *H03F 3/245* (2013.01); *H03K 17/08122* (2013.01); *H03K 17/102* (2013.01); *H03K 17/162* (2013.01); *H03K 17/284* (2013.01); *H03K 17/693* (2013.01); *H04B 1/04* (2013.01); *H02M 2001/0045* (2013.01); *H03F 2200/102* (2013.01); *H03F 2200/336* (2013.01); *H03F 2203/7236* (2013.01); *H03F 2203/7239* (2013.01); *H03K 2217/0054* (2013.01); *H04B 2001/045* (2013.01); *H04B 2001/0408* (2013.01)

(58) Field of Classification Search
CPC .......... H03F 1/0222; H03F 1/22; H03F 3/193; H03F 3/2171; H03F 3/245; G10H 1/057; H03K 17/08122; H03K 17/102; H03K 17/162; H03K 17/284; H03K 17/693; H04B 1/04
USPC .......................................... 84/627
See application file for complete search history.

(56) References Cited

U.S. PATENT DOCUMENTS 4,336,736 A * 6/1982 Mishima .................. G10H 7/06
                                                        84/627
4,367,670 A * 1/1983 Howell .................. H03K 4/023
                                                        84/627

(Continued)

*Primary Examiner* — David S Warren
*Assistant Examiner* — Christina M Schreiber
(74) *Attorney, Agent, or Firm* — Knobbe, Martens, Olson & Bear, LLP

(57) ABSTRACT

Aspects of this disclosure relate to a switching circuit with enhanced linearity. The switching circuit can include a switch and an envelope generator. The switch can receive an input signal, provide an output signal, and receive an envelope signal corresponding to an envelope of the input signal. The envelope generator can generate the envelope signal so as to cause intermodulation distortion in the output signal to be reduced to cause linearity of the switch to be improved.

20 Claims, 18 Drawing Sheets

(51) Int. Cl.
*H03F 3/193*     (2006.01)
*H03F 3/217*     (2006.01)
*H03F 3/24*      (2006.01)
*H03K 17/0812*   (2006.01)
*H03K 17/10*     (2006.01)
*H03K 17/16*     (2006.01)
*H03K 17/284*    (2006.01)
*H03K 17/693*    (2006.01)
*H04B 1/04*      (2006.01)
*G10H 1/057*     (2006.01)
*H02M 1/00*      (2006.01)

(56) References Cited

U.S. PATENT DOCUMENTS

| | | | | |
|---|---|---|---|---|
| 4,487,098 A * | 12/1984 | Mishima | G10H 1/0575 | 84/627 |
| 5,196,735 A * | 3/1993 | Meier | H02J 7/00 | 307/108 |
| 6,198,347 B1 * | 3/2001 | Sander | H03C 5/00 | 330/251 |
| 6,404,823 B1 * | 6/2002 | Grange | H03F 1/0222 | 330/10 |
| 6,784,744 B2 * | 8/2004 | Tichauer | H03G 1/0017 | 327/534 |
| 6,921,982 B2 * | 7/2005 | Joshi | H01L 21/84 | 257/349 |
| 6,970,040 B1 * | 11/2005 | Dening | H03F 1/0277 | 330/124 R |
| 7,949,316 B2 * | 5/2011 | Takinami | H03F 1/0227 | 455/108 |
| 8,145,147 B2 * | 3/2012 | Sander | H03G 3/3042 | 455/108 |
| 8,198,941 B2 * | 6/2012 | Lesso | H03F 1/0227 | 330/297 |
| 8,451,054 B2 * | 5/2013 | Kunihiro | H03F 1/0222 | 330/136 |
| 8,497,737 B2 * | 7/2013 | Langer | H03F 1/0272 | 330/285 |
| 8,509,715 B2 * | 8/2013 | Kanno | H03F 1/0222 | 455/127.1 |
| 8,633,768 B2 * | 1/2014 | Takahashi | H03F 3/2173 | 330/10 |
| 8,655,293 B2 * | 2/2014 | Langer | H04B 1/04 | 455/103 |
| 8,981,851 B2 * | 3/2015 | Hori | H03F 3/189 | 330/136 |
| 9,008,597 B2 * | 4/2015 | Levesque | H03F 3/193 | 455/127.1 |
| 9,054,643 B2 * | 6/2015 | Collados Asensio | H03F 1/02 | |
| 9,461,599 B2 * | 10/2016 | Morshedi | H03F 3/19 | |
| 9,614,440 B2 * | 4/2017 | Oishi | H03F 1/0222 | |
| 9,929,695 B2 * | 3/2018 | Zhang | H03F 1/02 | |
| 9,973,148 B2 * | 5/2018 | Zhu | H03K 17/102 | |
| 2004/0229577 A1 * | 11/2004 | Struble | H03K 17/063 | 455/127.1 |
| 2005/0270103 A1 * | 12/2005 | Constantin | H03F 1/0261 | 330/285 |
| 2007/0249304 A1 * | 10/2007 | Snelgrove | H03F 1/0205 | 455/127.2 |
| 2008/0272750 A1 * | 11/2008 | Aitto-Oja | H02M 3/1584 | 323/266 |
| 2010/0117713 A1 * | 5/2010 | Katoh | H03K 17/063 | 327/427 |
| 2011/0025404 A1 * | 2/2011 | Cassia | H03K 17/08122 | 327/436 |
| 2012/0049953 A1 * | 3/2012 | Khlat | H03F 1/0227 | 330/127 |
| 2013/0127556 A1 * | 5/2013 | Hori | H03F 3/189 | 332/106 |
| 2013/0141063 A1 * | 6/2013 | Kay | G05F 1/468 | 323/271 |
| 2013/0141064 A1 * | 6/2013 | Kay | G05F 1/46 | 323/271 |
| 2014/0057684 A1 * | 2/2014 | Khlat | H04W 52/0209 | 455/574 |
| 2014/0184336 A1 * | 7/2014 | Nobbe | H03F 1/0227 | 330/296 |
| 2014/0266427 A1 * | 9/2014 | Chiron | H03F 1/26 | 330/127 |
| 2015/0105032 A1 * | 4/2015 | Wang | H03K 17/161 | 455/77 |
| 2015/0270806 A1 * | 9/2015 | Wagh | H03F 3/211 | 330/296 |
| 2016/0182049 A1 * | 6/2016 | Krug | H03K 19/017545 | 327/108 |
| 2016/0277045 A1 * | 9/2016 | Langer | H04B 1/0475 | |
| 2017/0005623 A1 * | 1/2017 | Zhu | H03F 1/3205 | |
| 2017/0005624 A1 * | 1/2017 | Zhu | H03F 1/3205 | |
| 2017/0005625 A1 * | 1/2017 | Zhu | H03F 1/3205 | |
| 2017/0005626 A1 * | 1/2017 | Zhu | H03F 1/3205 | |
| 2017/0133989 A1 * | 5/2017 | Dykstra | H03F 1/3205 | |
| 2018/0041170 A1 * | 2/2018 | Zhu | H03K 17/102 | |
| 2018/0041204 A1 * | 2/2018 | Zhu | H03K 17/102 | |
| 2018/0331657 A1 * | 11/2018 | Zhu | H03K 17/693 | |

\* cited by examiner

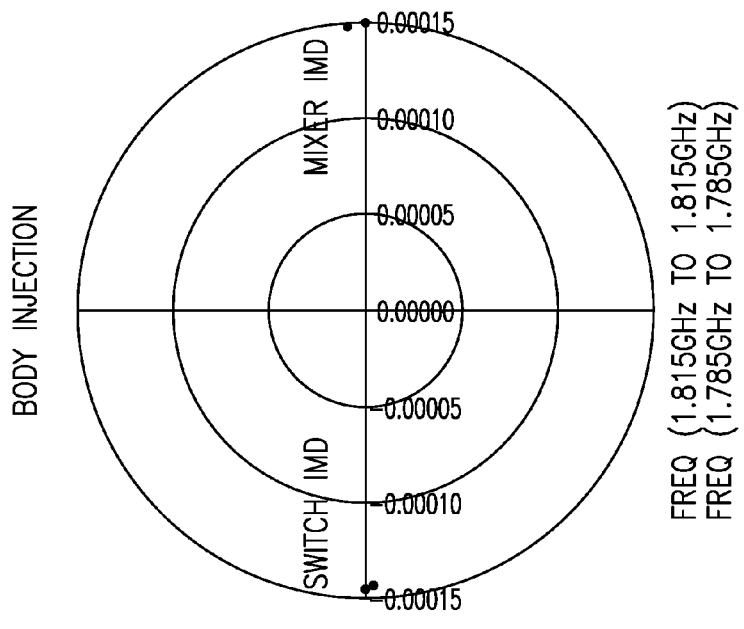
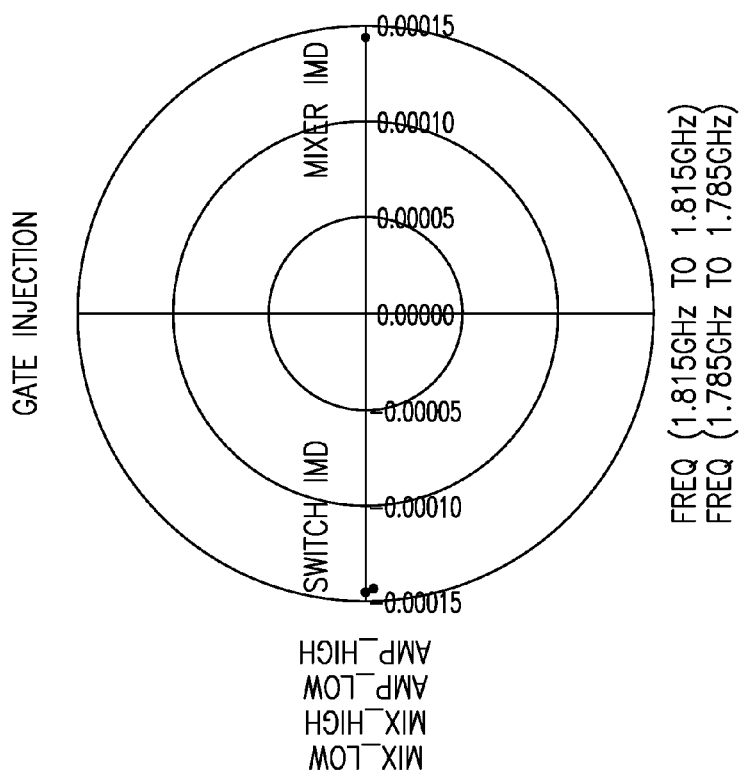

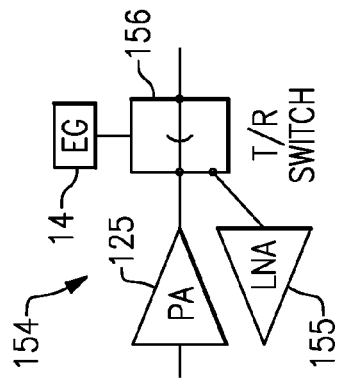
FIG.21
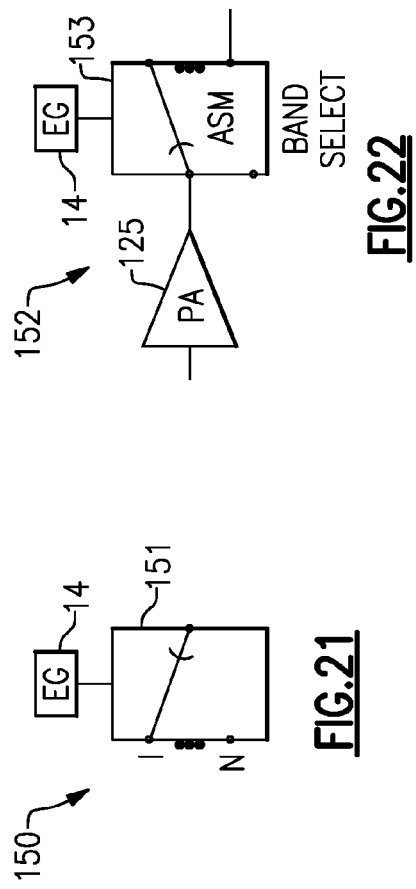
FIG.22
FIG.23
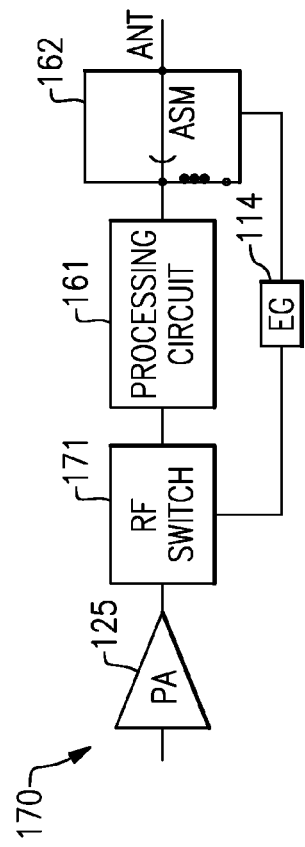
FIG.24
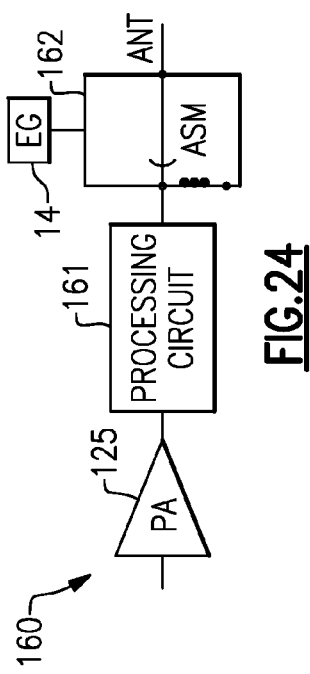
FIG.25

SWITCH WITH ENVELOPE INJECTION

CROSS REFERENCE TO PRIORITY APPLICATION

Any and all applications for which a foreign or domestic priority claim is identified in the Application Data Sheet as filed with the present application are hereby incorporated by reference under 37 CFR § 1.57. This application claims the benefit of priority under 35 U.S.C. § 119(e) of U.S. Provisional Patent Application No. 62/372,198, filed Aug. 8, 2016 and titled "SWITCH WITH ENVELOPE INJECTION," the disclosure of which is hereby incorporated by reference in its entirety herein.

BACKGROUND

Technical Field

Embodiments of this disclosure relate to electronic systems and, in particular, to electronic systems that include a switch.

Description of Related Technology

A radio frequency (RF) switch can pass an RF signal. RF switches can be implemented in a variety of applications, such as in RF front end systems that include circuitry coupled between an antenna and a baseband system.

RF switches can include transistors, such as field effect transistors. Such RF switches can behave non-linearity, which can cause intermodulation distortion. Compensating for the non-linear behavior of the switch can increase linearity of the RF switch, which can be desirable.

SUMMARY OF CERTAIN INVENTIVE ASPECTS

The innovations described in the claims each have several features, no single one of which is solely responsible for its desirable attributes. Without limiting the scope of the claims, some prominent features of this disclosure will now be briefly described.

One aspect of this disclosure is a switching circuit with enhanced linearity. The switching circuit includes a switch and an envelope generator. The switch is configured to receive an input signal, provide an output signal, and receive an envelope signal corresponding to an envelope of the input signal. The envelope generator is configured to generate the envelope signal so as to cause intermodulation distortion in the output signal to be reduced. The envelope generator is configured to adjust a phase of the envelope signal.

The switch can include a field effect transistor having a body configured to receive the envelope signal. The switch can receive the envelope signal at a control terminal. For instance, the switch can include a field effect transistor and the control terminal can be a gate of the field effect transistor. The envelope signal can be superimposed on a direct current control signal at the control terminal. The switch can turn on and to turn off in response to the direct current control signal. The input signal can be a radio frequency signal and the switch can be a radio frequency switch.

The input signal can have a first tone at a first frequency and a second tone at a second frequency, and the envelope signal can have a frequency corresponding to a difference between the first frequency and the second frequency.

The envelope generator can adjust the phase of the envelope signal adjust such that intermodulation associated with mixing of the envelope signal and the input signal has substantially an opposite phase as intermodulation due to non-linear behavior of the switch. A phase shifter of the envelope generator can adjust the phase of the envelope signal. The envelope generator can adjust a magnitude of the envelope signal.

The envelope generator can receive the input signal and to generate the envelope signal based on the input signal. The envelope generator can receive the input signal and the output signal and to generate the envelope signal based on the input signal and the output signal.

The envelope generator can be coupled to an envelope tracking modulator configured to provide a power amplifier supply voltage to a power amplifier.

Another aspect of this disclosure is a radio frequency system that includes a radio frequency source configured to provide a radio frequency signal, a switch configured to pass the radio frequency signal, and an envelope generator configured to generate an envelope signal corresponding to an envelope of the radio frequency signal and to apply the envelope signal to the switch to cause intermodulation distortion in the radio frequency signal to be reduced. The envelope generator is configured to adjust a phase of the envelope signal The envelope generator can adjust a magnitude of the envelope signal.

The switch can include a field effect transistor having a body and the envelope generator can apply the envelope signal to the body. The switch can include a field effect transistor having a gate configured to receive the envelope signal superimposed on a control signal.

The radio frequency source can include a power amplifier. The switch can be included in an antenna switch, a band select switch, or a transmit/receive switch.

Another aspect of this disclosure is a method of switching a radio frequency signal with improved linearity. The method includes generating an envelope signal with an envelope generator, the envelope generator configured to adjust a phase of the envelope signal; providing the envelope signal to a radio frequency switch; and switching the radio frequency signal using the radio frequency switch while the radio frequency switch receives the envelope signal such that the envelope signal reduces intermodulation distortion associated with the radio frequency switch The method can include setting the phase and a magnitude of the envelope signal. The radio frequency switch can include a field effect transistor and the providing can include applying the envelope signal to a body of the field effect transistor. The radio frequency switch can include a field effect transistor and the providing can include applying the envelope signal superimposed on a control signal to a gate of the field effect transistor.

Another aspect of this disclosure is power amplifier system that includes an envelope generator configured to generate an envelope signal corresponding to an envelope of a radio frequency signal, a power amplifier coupled to the envelope generator, and a radio frequency switch coupled to an output of the power amplifier. The power amplifier is configured to amplify a radio frequency signal and to receive a power amplifier supply voltage that is based on the envelope of the radio frequency signal. The radio frequency switch is configured to receive the envelope signal from the envelope generator to cause intermodulation distortion associated with the radio frequency switch to be reduced.

The radio frequency switch can include a field effect transistor having a body configured to receive the envelope signal. The radio frequency switch can include a field effect transistor having a gate configured to receive the envelope signal superimposed on a direct current control signal.

The envelope generator can adjust a phase of the envelope signal. The envelope generator can adjust a magnitude of the envelope signal. The envelope generator can generate the envelope signal from a baseband signal.

The power amplifier system can include an envelope tracking modulator coupled to an output of the envelope generator and configured to generate the power amplifier supply voltage.

A band select switch can include the radio frequency switch. An antenna switch can include the radio frequency switch. A transmit/receive switch can include the radio frequency switch.

Another aspect of this disclosure is a radio frequency system that includes an envelope generator configured to generate an envelope signal corresponding to an envelope of a radio frequency signal, a radio frequency switch configured to pass the radio frequency signal, and an other radio frequency component coupled to the envelope generator. The radio frequency switch is configured to receive the envelope signal to cause intermodulation distortion associated with the radio frequency switch to be reduced.

The other radio frequency component can be a power amplifier configured to receive a supply voltage that is based on the envelope signal. The other radio frequency component can include a second radio frequency switch. The radio frequency switch and the second radio frequency switch can both be included in a signal path between a power amplifier and an antenna port.

Another aspect of this disclosure is a method of switching a radio frequency signal with improved linearity. The method includes generating, with an envelope generator, an envelope signal corresponding to an envelope of a radio frequency signal; providing a power amplifier supply voltage to a power amplifier that is coupled to the envelope generator; applying the envelope signal to a radio frequency switch configured to receive the radio frequency signal from the power amplifier; and switching the radio frequency signal using the radio frequency switch during said applying so as to reduce intermodulation distortion associated with the radio frequency switch.

The applying can include applying the envelope signal to a control terminal of the radio frequency switch. The radio frequency switch can include a field effect transistor and the applying can include applying the envelope signal to a body of the field effect transistor. The method can include generating the power amplifier supply voltage with an envelope tracking modulator that is coupled to an output of the envelope generator. The method can include generating the power amplifier supply voltage based on the envelope signal.

Another aspect of this disclosure is a switching circuit with enhanced linearity. The switching circuit includes an envelope generator configured to generate an envelope signal and a switch including a field effect transistor having a body configured to receive the envelope signal so as to cause linearity of the switch to be improved.

Another aspect of this disclosure is a switching circuit with enhanced linearity. The switching circuit includes a switch configured to receive an input signal, to provide an output signal, and to receive an envelope signal. The switching circuit includes an envelope generator configured to receive the input signal, to receive the output signal, and to generate the envelope signal so as to cause linearity of the switch to be improved. In some instances, the envelope generator can generate the envelope signal based on a difference in voltage between the input signal and the output signal.

Another aspect of this disclosure is a switching circuit with enhanced linearity. The switching circuit includes an envelope generator configured to generate an envelope signal and means for switching a radio frequency signal with enhanced linearity using the envelope signal.

Another aspect of this disclosure is a switch with enhanced linearity. The switch includes an input configured to receive an input signal and an output configured to provide an output signal. The switch is configured to receive a signal including an envelope component corresponding to the input signal to substantially cancel intermodulation distortion associated with the switch.

Another aspect of this disclosure is a semiconductor die that includes an envelope generator configured to generate an envelope signal and a switch configured to receive the envelope signal from the envelope generator to cause linearity of the switch to be improved. The switch and the envelope generator are included on the same semiconductor die.

The semiconductor die can be a semiconductor-on-insulator die. The semiconductor-on-insulator die can be a silicon-on-insulator die. The semiconductor die can include a power amplifier. The semiconductor die can include an envelope tracking modulator coupled to the envelope generator and configured to provide a supply voltage to the power amplifier.

Another aspect of this disclosure is a radio frequency module that includes an envelope generator configured to generate an envelope signal, a switch configured to provide a radio frequency signal and to receive the envelope signal from the envelope generator to cause intermodulation distortion in the radio frequency signal to be reduced, and a package enclosing the envelope generator and the switch.

The switch can be included in an antenna switch. The switch can be included in a band select switch. The switch can be included in a transmit/receive switch.

Another aspect of this disclosure is a wireless communication device that includes an antenna; a power amplifier configured to provide a radio frequency signal; an envelope generator configured to generate an envelope signal associated with the radio frequency signal; and a radio frequency switch in a signal path between the power amplifier and the antenna, the radio frequency switch configured to receive the envelope signal.

Another aspect of this disclosure is a method of generating an envelope signal to apply to a switch. The method includes setting a phase of the envelope signal to apply to the switch so as to cause intermodulation distortion associated with the switch to be decreased; and setting a magnitude of the envelope signal with the set phase so as to cause the intermodulation distortion associated with the switch to be further decreased.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 15/670,619, titled "RADIO FREQUENCY SYSTEM WITH SWITCH TO RECEIVE ENVELOPE," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 12A is a simulation of intermodulation distortion corresponding to envelope signal injection at a gate of a field effect transistor switch.

FIG. 12B is a simulation of intermodulation distortion corresponding to envelope signal injection at a body of a field effect transistor switch.

FIG. 21 is a schematic diagram that illustrates a multi-throw switch with envelope injection according to an embodiment.

FIG. 22 is a schematic diagram of an electronic system that includes envelope injection in a band select switch according to an embodiment.

FIG. 23 is a schematic diagram of an electronic system that includes envelope injection in a transmit/receive switch according to an embodiment.

FIG. 24 is a schematic diagram of an electronic system that includes an envelope injection in an antenna switch according to an embodiment.

FIG. 25 is a schematic diagram of an electronic system that includes an envelope injection in a plurality of RF switches in an RF signal path according to an embodiment.

DETAILED DESCRIPTION OF CERTAIN EMBODIMENTS

Figure 1:
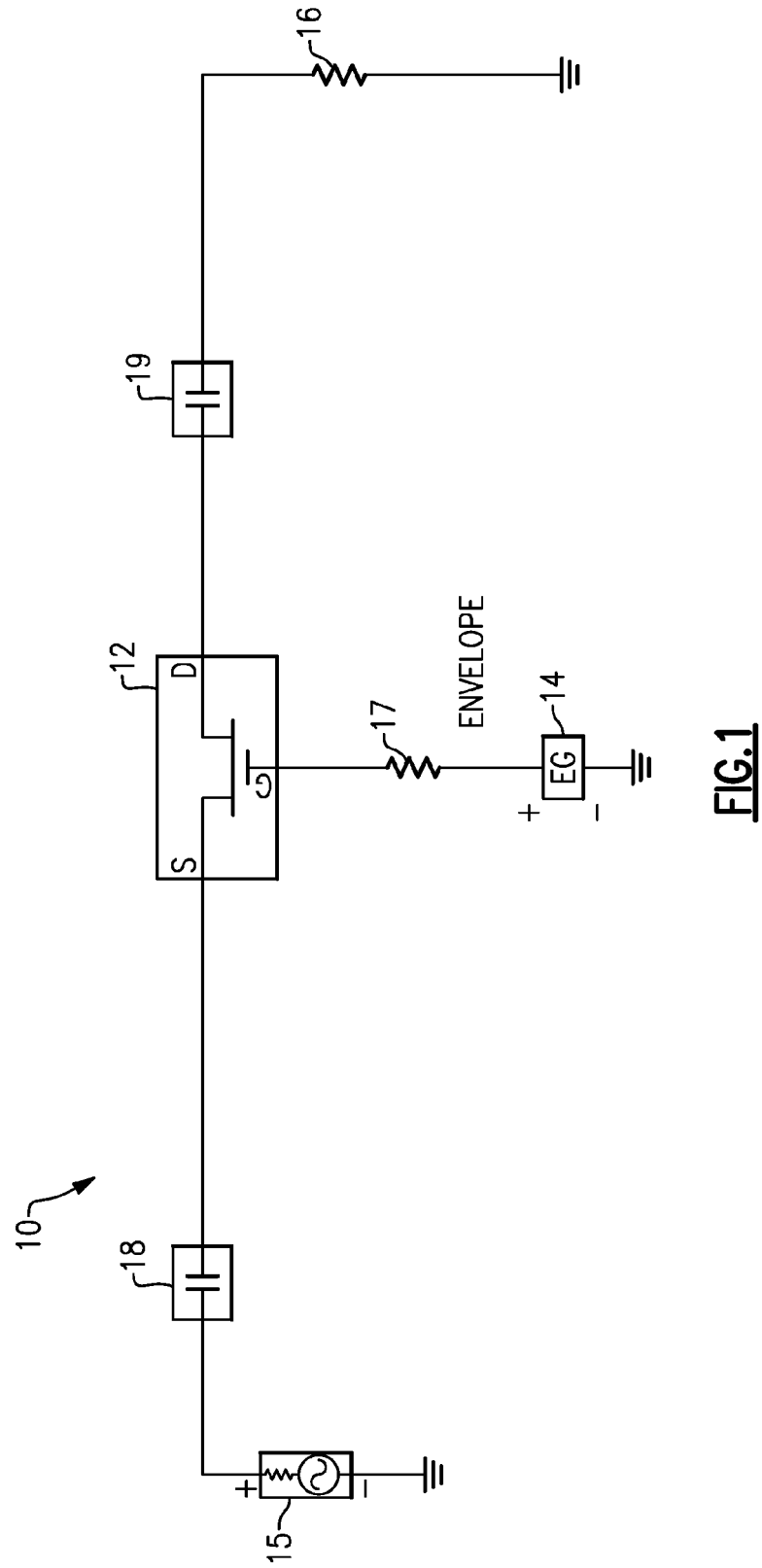
FIG. 1 is a schematic diagram of an electronic system with a switching circuit according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate substantially identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Linearity is one parameter of a switch. A switch with a relatively high linearity can be advantageous in a number of applications. Some efforts to improve linearity of a switch involved device optimization in terms of size, body contact, and substrate. Some other efforts to improve switch linearity involved circuit optimization in terms of device combination, layout, and passive circuit elements. Even with such efforts to improve linearity, there is a call for improved linearity in certain applications.

Aspects of this disclosure relate to improving linearity of a switch using an envelope signal. Such an envelope signal can correspond to an envelope of an input signal of the switch, for example, a voltage envelope of the input signal. In a switch implemented with a field effect transistor, the envelope signal can be injected by way of a gate terminal and/or a body terminal. Switches with envelope signal injection can have intermodulation distortion generated due to (1) the nonlinear I-V behavior of the switch and (2) the dynamic interaction between a radio frequency (RF) input signal and an envelope signal. Relatively high switch linearity can be achieved due to cancellation between these two kinds of intermodulation distortion.

Switches with enhance linearity are disclosed herein. Such switches can cancel intermodulation distortion, such as third order intermodulation distortion (IMD3), over a relatively wide range of voltage standing wave ratio (VSWR). In an embodiment, a switch includes an input configured to receive an input signal and an output configured to provide an output signal, and the switch is configured to receive a signal including an envelope component of the input signal to cancel intermodulation distortion associated with the switch. The switch can be a radio frequency switch configured to pass a radio frequency signal. An envelope generator can generate the envelope signal. The envelope generator can provide the envelope signal and the switch can include a field effect transistor configured to receive the envelope signal at a gate terminal and/or body terminal. The envelope generator can generate the envelope signal based on an input and/or an output of the switch. Any of the switches disclosed herein can be implemented in various semiconductor die, packaged modules, radio frequency systems, and wireless communications devices, for example.

FIG. 1 is a schematic diagram of an electronic system 10 with a switching circuit according to an embodiment. As illustrated, the electronic system 10 includes a switch 12, an envelope generator 14, a radio frequency (RF) source 15, a load 16, a biasing element 17, an input direct current (DC) blocking capacitor 18, and an output DC blocking capacitor 19. A switching circuit can include the switch 12 and the envelope generator 14.

In the electronic system 10, the switch 12 includes a field effect transistor and an envelope signal is injected at a gate of the field effect transistor. The envelope signal can correspond to an envelope of the input signal. Injecting the envelope signal at the gate of the field effect transistor can cause the field effect transistor to be a more linear switch. The switch 12 can receive a radio frequency (RF) input signal at a source and provide an RF output signal at a drain. In some other embodiments, a field effect transistor switch can receive an RF input signal at a drain and provide an RF output signal at a source. The envelope signal can be superimposed on a control signal provided to the gate of the field effect transistor. The control signal can be a DC signal. The switch 12 can turn on in response to the control signal and turn off in response to the control signal. The envelope signal can be applied to the gate of the field effect transistor by way of a biasing element 17. As illustrated in FIG. 1, the biasing element 17 can be a resistor. Such a resistor can have a resistance on the order of 10 kΩ in certain implementations.

The envelope generator 14 can generate the envelope signal. For instance, the envelope generator 14 can generate the envelope signal based on the RF input to the switch 12 and/or the RF output of the switch 12. As another example, the envelope generator 14 can generate the envelope signal based on a baseband signal. The envelope generator 12 can be implemented by any suitable circuit elements configured to generate the envelope signal. The envelope generator 14 can adjust a phase and/or a magnitude of the envelope signal. For instance, the envelope generator 14 can include a phase shifter to adjust a phase of the envelope signal. Alternatively or additionally, the envelope generator 14 can include a variable gain element configured to adjust a magnitude of the envelope signal.

The RF source 15 can be any suitable circuit configured to provide the RF input signal to the switch 12. The RF input signal can have tones at frequencies ω1 and ω2 in certain applications. As will be discussed with more detail in connection with FIG. 2, the envelope signal can have a frequency of ω3, which can correspond to the difference between ω1 and ω2. As an illustrative example, ω1 can be 1860 MHz, ω2 can be 1900 MHz, and ω3 can be 40 MHz. The RF source 15 can provide an RF signal that has a DC component and an RF component. The input DC blocking capacitor 18 can block the DC signal component of the RF signal provided by the RF source 15 and provide the RF signal component to the switch 12.

The switch 12 can provide the RF output signal to the load 16. The load 16 can have an impedance of 50Ω in certain implementations. The load can receive a signal from the switch 12 by way of the output DC blocking capacitor 19.

Figure 2:
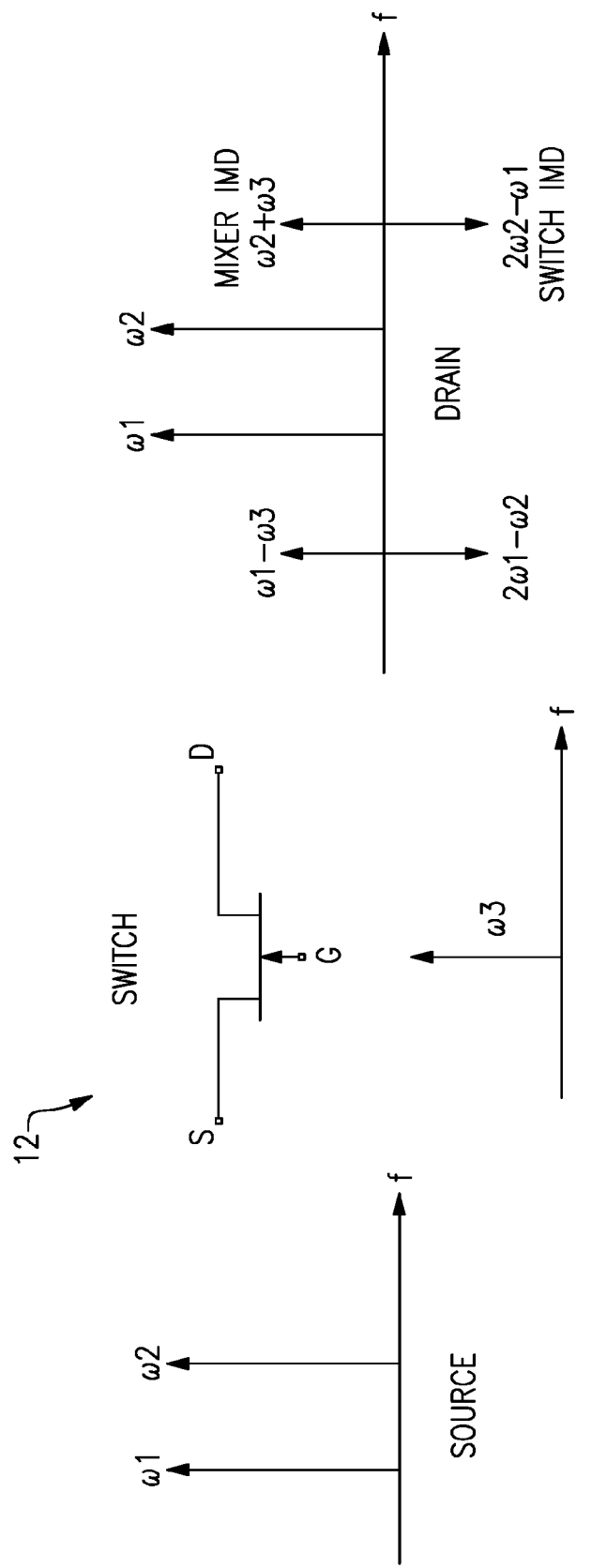
FIG. 2 illustrates a switch and graphs of frequency components at terminals of the switch according to an embodiment.

FIG. 2 illustrates a switch 12 and graphs of frequency components at terminals of the switch 12 according to an embodiment. The illustrated switch 12 is a field effect transistor having a source, a gate, and a drain. The field effect transistor can be a metal oxide semiconductor field effect transistor. The field effect transistor can be implemented using any suitable process technology such as semiconductor-on-insulator (e.g., silicon-on-insulator), complementary metal oxide semiconductor (CMOS), pseudomorphic High Electron Mobility Transistor (pHEMT), or the like. For instance, the field effect transistor can be a metal oxide semiconductor field effect transistor. The graph of the frequency components at the source of the filed effect transistor illustrates a two tone signal having frequency components at ω1 and ω2. Each of these tones can correspond to a sine wave in the time domain. There can be intermodulation distortion at the drain of the switch 12 at frequencies 2ω1−ω2 and 2ω2−ω1. This intermodulation distortion can be caused by a non-linearity of the switch 12, such as nonlinear I-V behavior of the switch 12.

To compensate for such intermodulation distortion, an envelope signal can be injected at the gate of the switch 12. The envelope signal can have a frequency corresponding to the difference in frequency between the tones ω1 and ω2 of the input signal. The envelope signal can be a sine wave in the time domain. As illustrated in the graph for the frequency components at the gate of the switch 12, the envelope signal provided to the gate can have a frequency of ω3, in which ω3=ω2−ω1.

Injecting the envelope signal at the gate of the field effect transistor can cause mixing between the envelope signal and the signal provided to the source of the field effect transistor. Such mixing can result in signal components at frequencies of ω1−ω3 and ω2+ω3. By having ω3=ω2−ω1, the intermodulation distortion due to non-linearity of the switch 12 and the mixing due to injection of the envelope signal can cancel each other and thereby improve the linearity of the switch 12. Such cancelation can reduce the intermodulation distortion in the signal at the drain of the illustrated switch 12 significantly. FIG. 2 includes a graph with frequency components at a drain of the switch 12. This graph illustrates cancellation of intermodulation distortion of the switch 12 at the drain of the switch 12.

Figure 3:
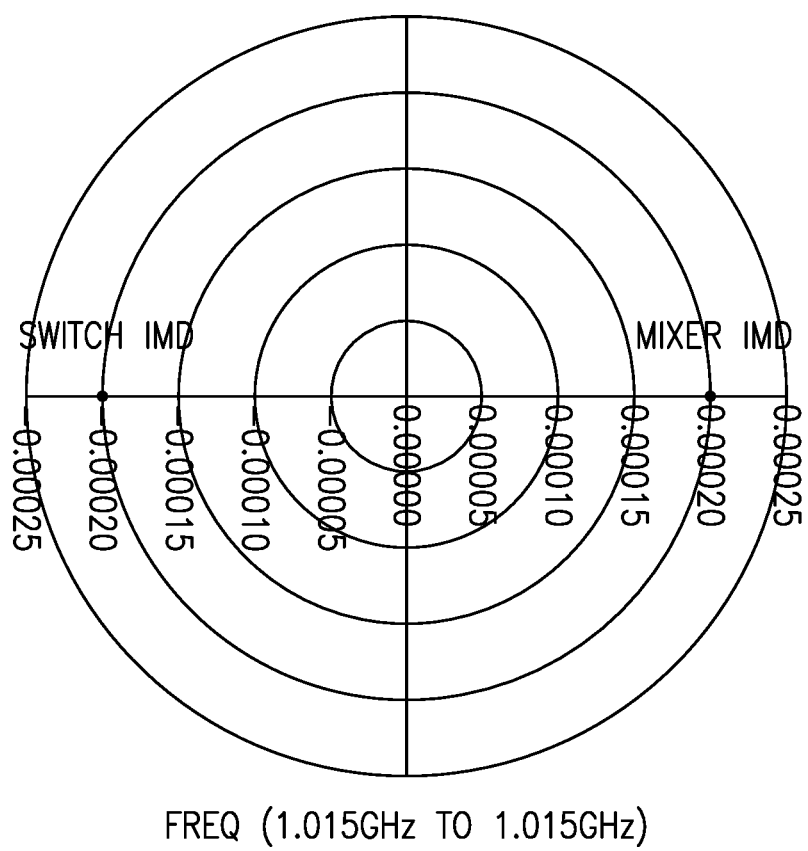
FIG. 3 is a graph of simulated intermodulation distortions of the switch of FIG. 2.

FIG. 3 is a graph of simulated intermodulation distortions of the switch 12 of FIG. 2. As shown in this graph, it can be desirable for the intermodulation distortion of the switch and the intermodulation distortion associated with the mixing of the envelope signal and the RF input signal to have substantially the opposite phase. This can promote cancellation of intermodulation distortion and enhance linearity of the switch. The intermodulation distortion of the switch can be fixed by the inherent non-linearity of the switch. The phase of the envelope signal can be adjusted such that intermodulation distortion associated with the envelope signal mixing with the RF signal has substantially the opposite phase as the intermodulation distortion of the switch. For instance, the envelope generator 14 of FIG. 1 can adjust the phase of the envelope signal. In certain embodiments, the envelope generator 14 can have a phase control input configured to receive a phase control signal.

Figure 4:
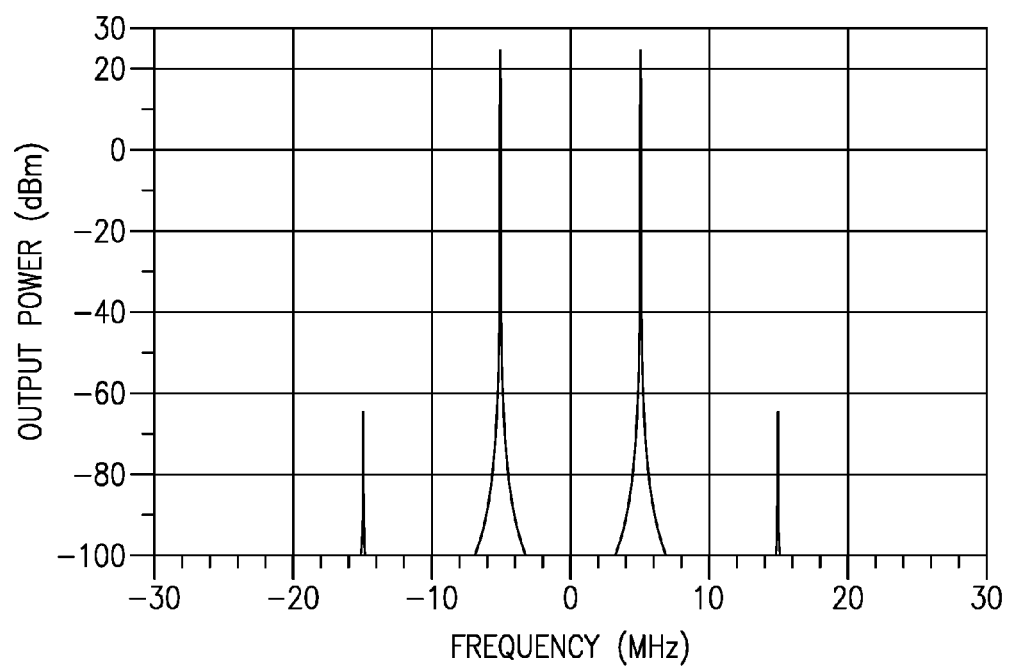
FIG. 4 is a graph illustrating a relationship between output power and frequency for the switch of FIG. 2.

FIG. 4 is a graph illustrating a relationship between output power and frequency for the switch 12 of FIG. 2. It can be desirable to have the intermodulation distortion of the switch and the intermodulation distortion associated with the mixing of the envelope signal and the RF input signal to have substantially the same magnitude. This can promote cancellation of intermodulation distortion and enhance linearity of the switch. The graph of FIG. 4 illustrates output power for a frequency spectrum at the drain of the switch of FIG. 2 for a fixed phase of the envelope signal. By sweeping through envelope magnitudes, a minimum intermodulation distortion can be determined. In the graph of FIG. 4, the intermodulation distortion is around −65 dBm. Simulations indicate that the intermodulation distortion can be reduced to below −80 dBm for certain magnitudes of the envelope signal injected at the gate of the switch.

Figure 5:
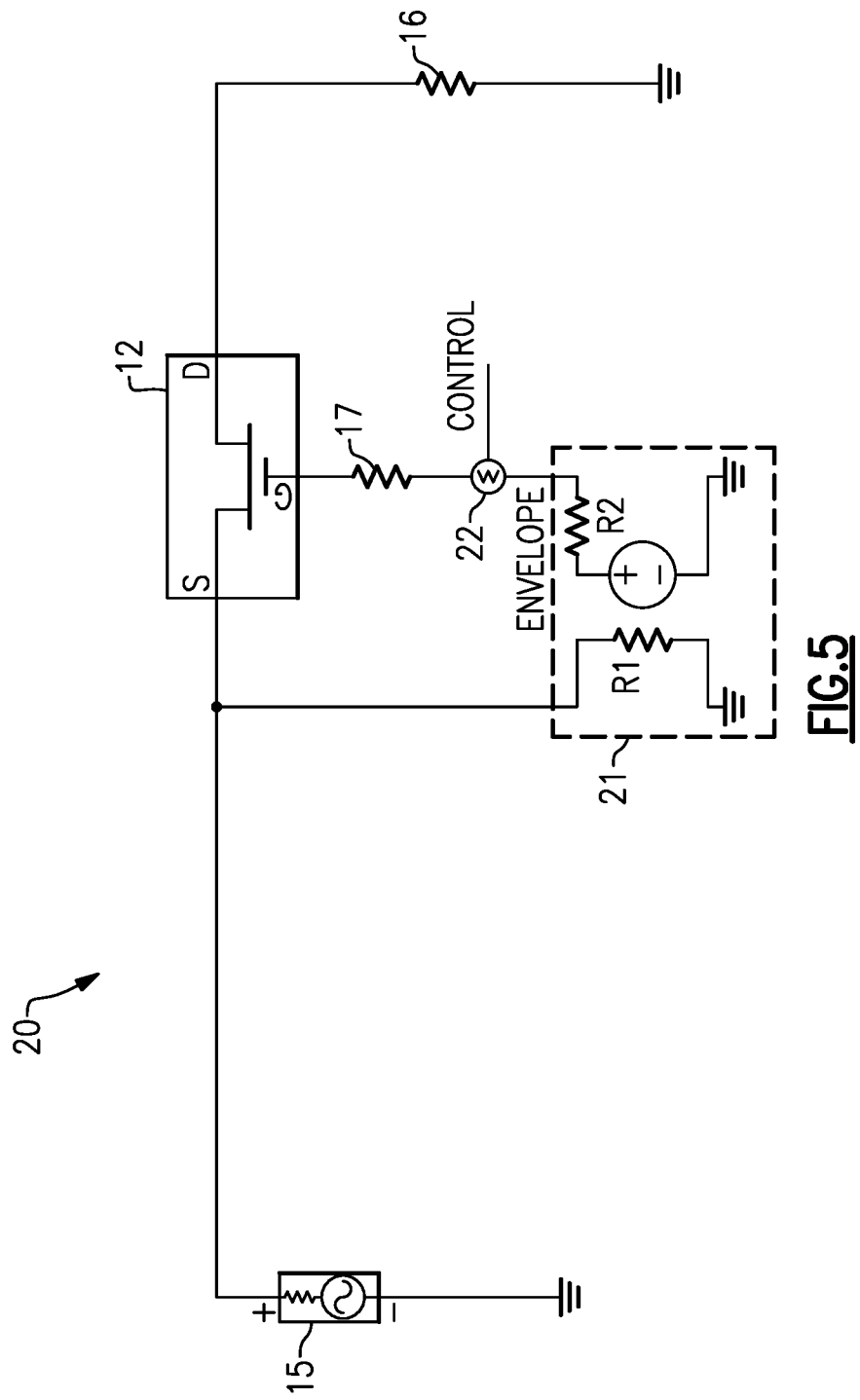
FIG. 5 is a schematic diagram of an electronic system with a switching circuit including an envelope generator configured to receive an input of the switch according to an embodiment.

FIG. 5 is a schematic diagram of an electronic system 20 with a switching circuit including an envelope generator 21 configured to receive an input of the switch 12 according to an embodiment. As illustrated, the electronic system 20 includes a switch 12, an RF source 15, a load 16, a biasing element 17, an envelope generator 21, and a signal combiner 22. A switching circuit can include the switch 12 and the envelope generator 21.

The envelope generator 21 is configured to receive an RF input signal provided to the switch 12. Most of the RF input signal can be provided to the switch 12 while a relatively small portion of the RF signal can be provided to the envelope generator 21. As shown in FIG. 5, the envelope generator 21 is coupled to the source of the switch 12. The envelope generator 21 can generate the envelope signal based on the RF input signal. When the RF input signal has tones at frequencies ω1 and ω2, the envelope signal can have a frequency of ω3, which can correspond to the difference between ω1 and ω2.

The signal combiner 22 can combine the envelope signal on a DC control signal. For instance, the signal combiner 22 can superimpose the envelope signal on the DC control signal. The signal combiner 22 can be implemented by a summing node or any suitable summing network configured to sum the envelope signal and the DC control signal. In another implementation, the signal combiner 22 can subtract the envelope signal from the DC control signal. An output of the signal combiner 22 can be provided to the gate of the switch 12 by way of the biasing element 17. A signal combiner in accordance with the principles and advantages of the signal combiner 22 of FIG. 5 can be implemented in association with any other embodiments disclosed herein, such as the embodiment shown in FIG. 1.

Figure 6:
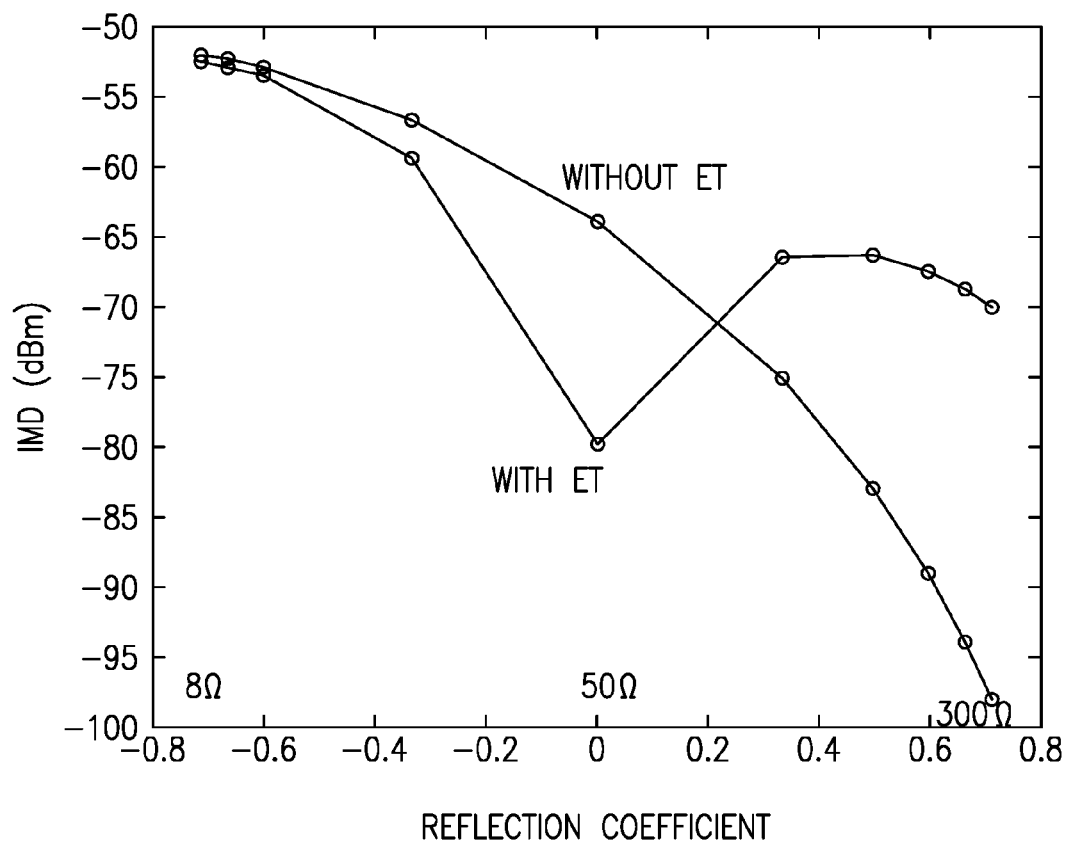
FIG. 6 is a graph of illustrating a relationship between intermodulation distortion and reflection coefficient for the switch of FIG. 5.

FIG. 6 is a graph of illustrating a relationship between intermodulation distortion and a reflection coefficient for the switch 12 of FIG. 5. As shown in FIG. 6, injecting the envelope signal at the gate of the switch 12 of the electronic system 20 of FIG. 5 can cause intermodulation distortion to be improved around 50Ω, such as in a range from about 10Ω to 100Ω. This graph also illustrates that intermodulation distortion of the switch 12 in the electronic system 20 of FIG. 5 can depend on load impedance. At higher load impedances, injecting the envelope signal at the gate of the switch 12 in the electronic system 20 of FIG. 5 can cause the intermodulation distortion to be higher in certain applications.

Figure 7:
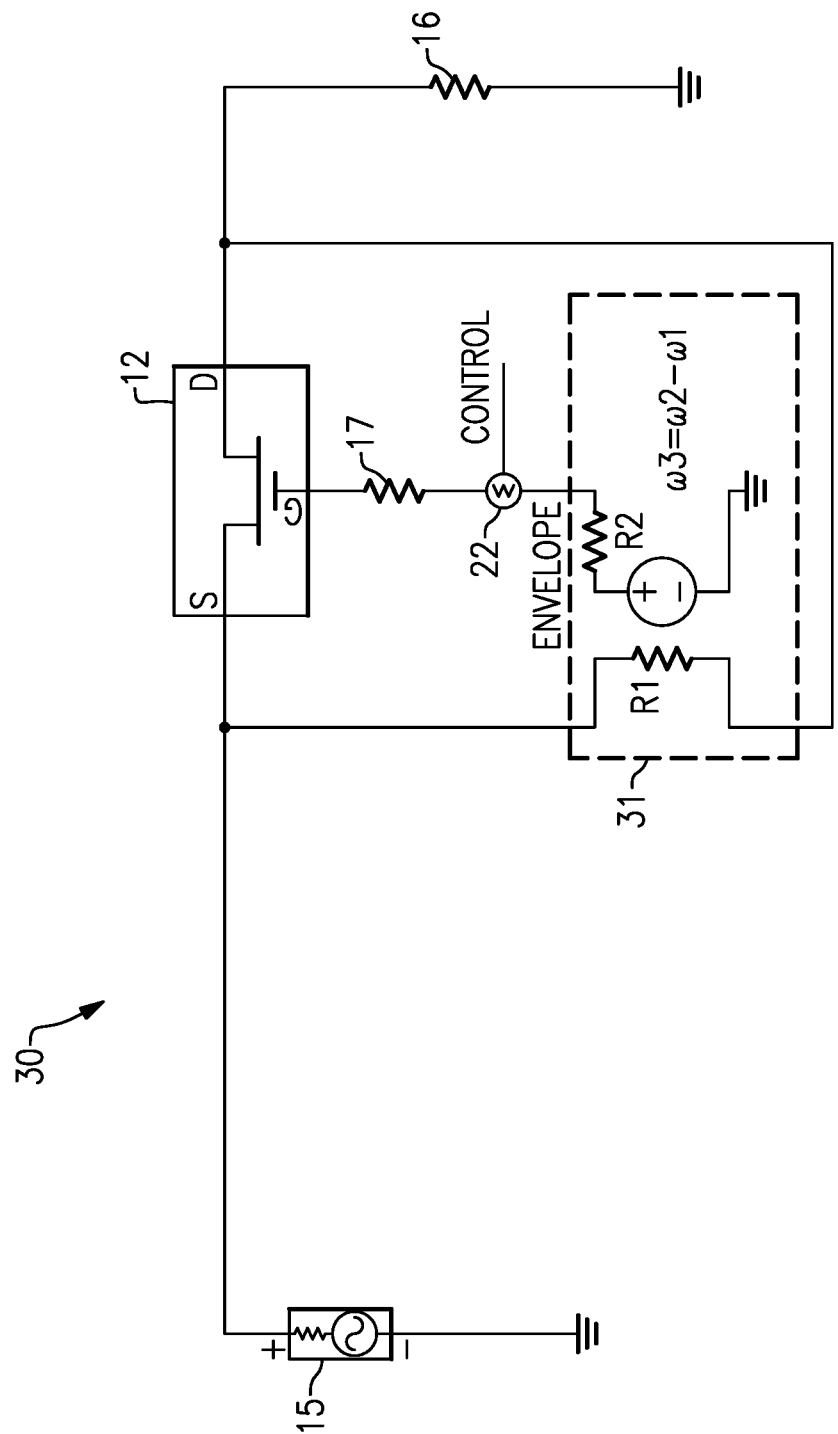
FIG. 7 is a schematic diagram of an electronic system with a switching circuit including an envelope generator configured to receive an input and an output of the switch according to an embodiment.

FIG. 7 is a schematic diagram of an electronic system 30 with a switching circuit including an envelope generator 31 configured to receive an input and an output of a switch 12 according to an embodiment. The electronic system 30 is similar to the electronic system 20 of FIG. 5 except that these systems include different envelope generators. The envelope generator 31 of FIG. 7 is configured to receive the RF input signal provided to the switch 12 and an RF output signal provided by the switch 12. As shown in FIG. 7, the envelope generator 31 is coupled to both the source and the drain of the switch 12. The envelope generator 31 can generate the envelope signal based on the voltage between the drain and the source of the switch 12. The voltage between the drain and the source of the switch 12 can be on the order of 0.1 Volts in certain implementations. With the envelope generator 31, an improvement in intermodulation distortion can be present over a wider range of load impedance relative to using the envelope generator 21 of FIG. 5.

Figure 8:
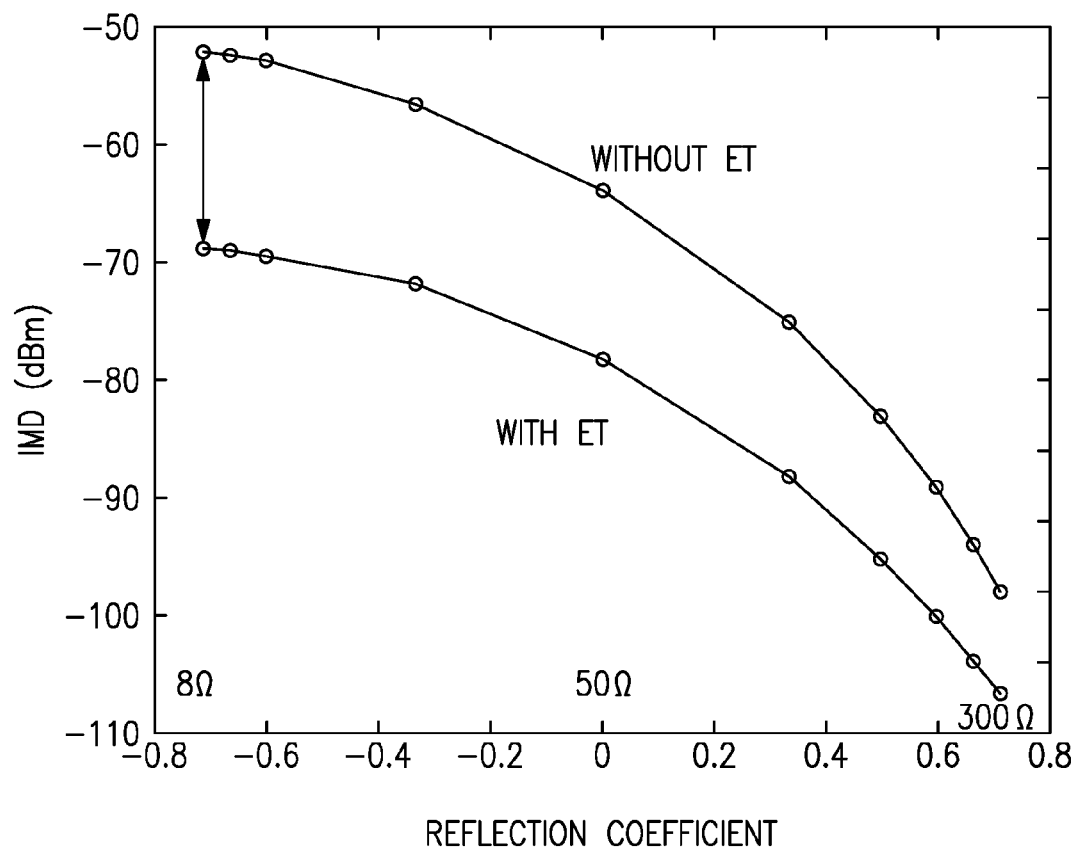
FIG. 8 is a graph of illustrating a relationship between intermodulation distortion and reflection coefficient for the switch of FIG. 7.

FIG. 8 is a graph of illustrating a relationship between intermodulation distortion and reflection coefficient for the switch 12 of FIG. 7. As shown in FIG. 8, injecting the envelope signal at the gate of the switch 12 of the electronic system 30 of FIG. 7 using the envelope generator 31 can cause intermodulation distortion to be improved as output impedance varies. Throughout the simulated output impedance range from 8Ω to 300Ω, the intermodulation distortion was decreased by applying an envelope signal to the switch 12. This graph indicates that intermodulation distortion can be improved by about 17 dBm in certain implementations.

Figure 9:
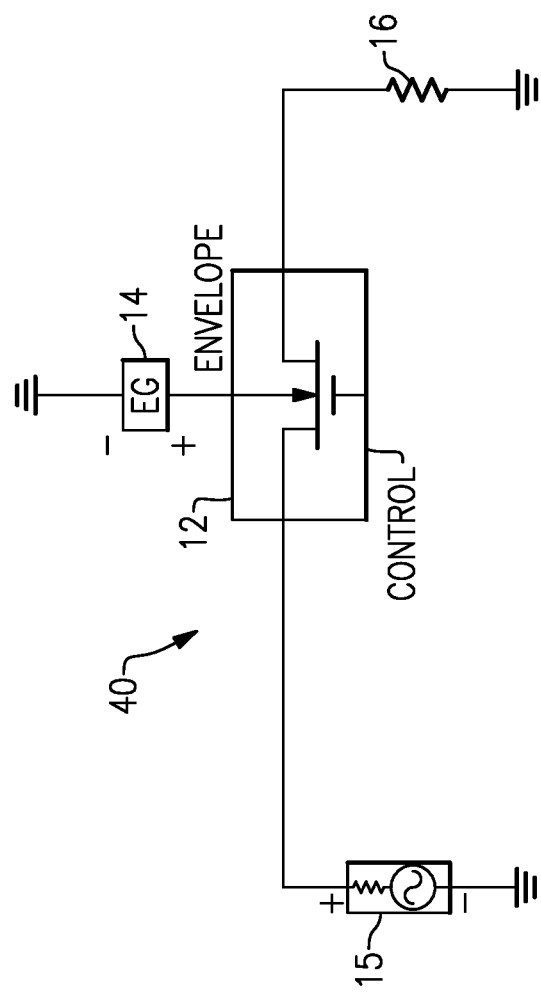
FIG. 9 is a schematic diagram of an electronic system with a switching circuit according to another embodiment.

FIG. 9 is a schematic diagram of an electronic system 40 with a switching circuit according to another embodiment. As illustrated, the electronic system 40 includes a switch 12, an envelope generator 14, an RF source 15, and a load 16. The switching circuit of FIG. 9 includes the switch 12 and the envelope generator 14. In the electronic system 40, the switch 12 includes a field effect transistor and the envelope generator 14 is configured to inject the envelope signal at a body of the field effect transistor to enhance linearity of the switch 12. Accordingly, the switch 12 can be linearized by injection the envelope signal by way of a semiconductor substrate on which the switch 12 is implemented.

Figure 10:
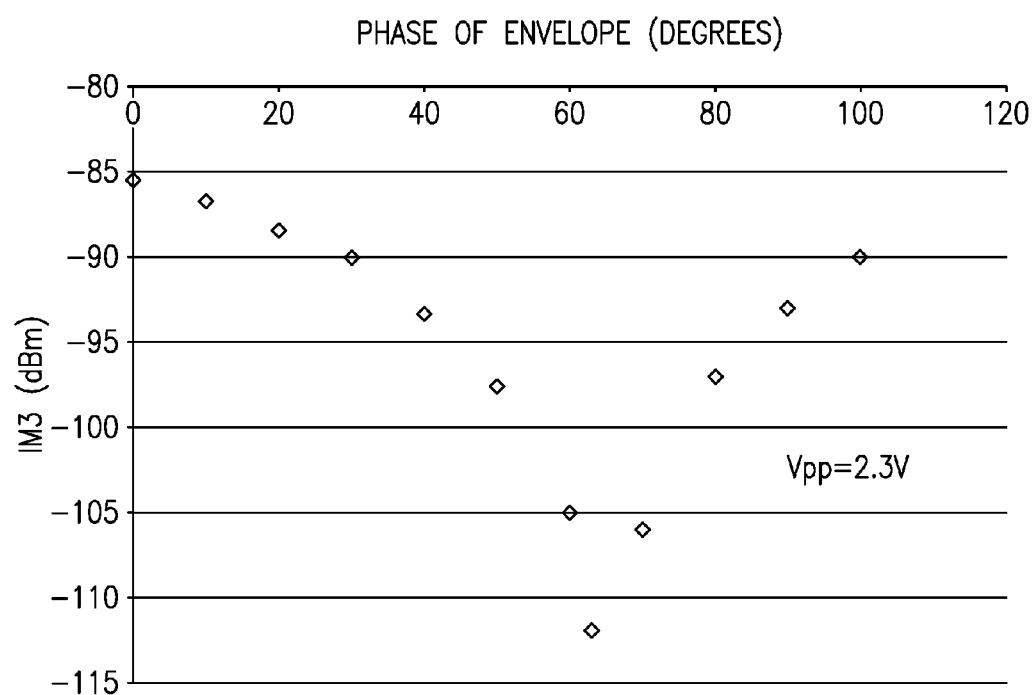
FIG. 10 is a graph of illustrating a relationship between intermodulation distortion and phase of an envelope signal for the switch of FIG. 9.

FIG. 10 is a graph of illustrating a relationship between intermodulation distortion and phase of an envelope signal for the switch 12 of FIG. 9. This graph corresponds to the RF input signal being provided to the source of the switch 12 of FIG. 9 having a first tone with a power of 22 dBm at a frequency of 1860 MHz and a second tone with a power of 22 dBm at a frequency of 1900 MHz and the envelope signal having a frequency of 40 MHz and a magnitude of 2.3 Volts. As shown in FIG. 10, intermodulation distortion can depend on the phase of the envelope signal injected at the body of the switch 12. This graph indicates that phase of about 63° can result in a minimum intermodulation distortion. Accordingly, an envelope signal with a phase of about 63° can cause intermodulation distortion associated with the envelope signal mixing with an RF input signal provided to the switch 12 to have substantially the opposite phase as the intermodulation distortion due to non-linear behavior of the switch 12.

Figure 11:
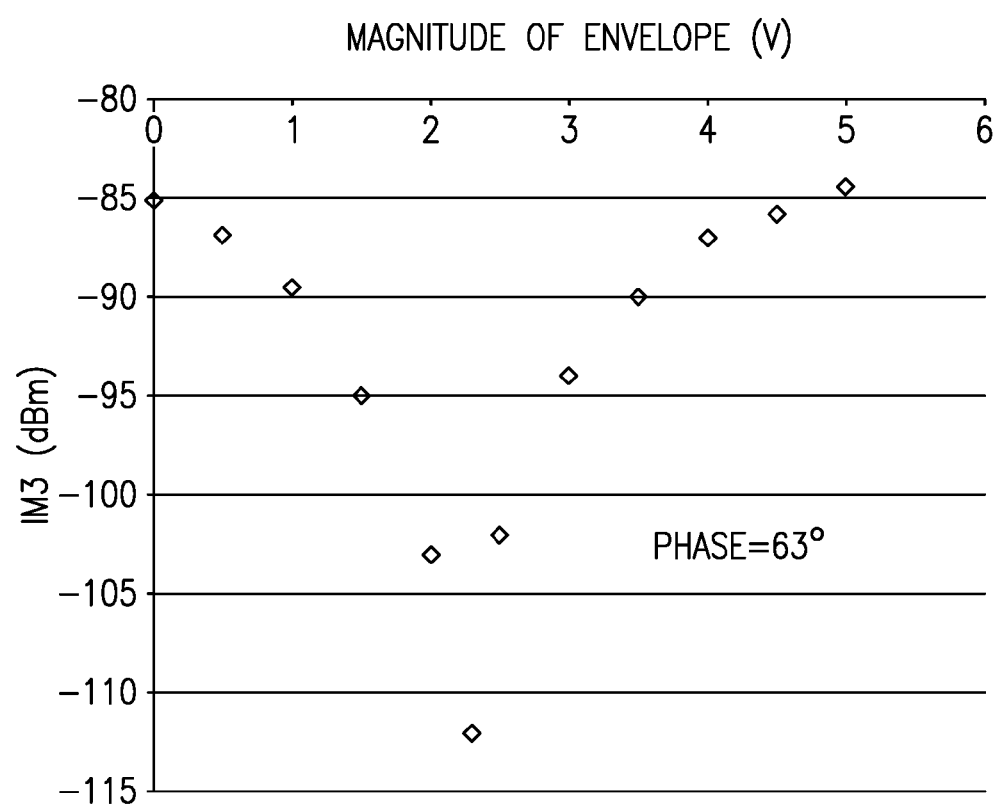
FIG. 11 is a graph of illustrating a relationship between intermodulation distortion and a magnitude of an envelope signal for the switch of FIG. 9.

FIG. 11 is a graph of illustrating a relationship between intermodulation distortion and a magnitude of an envelope signal for the switch 12 of FIG. 9. This graph corresponds to the same RF input signal and an envelope signal having the same frequency as the graph of FIG. 11, but the phase of the envelope signal is fixed at 63° for the envelope signal. As shown in FIG. 11, intermodulation distortion can depend on the magnitude of the envelope signal injected at the body of the switch 12. The intermodulation distortion can be at a minimum when that intermodulation due to interaction between an RF input signal and an envelope signal has a magnitude that is substantially the same as the intermodulation distortion due to non-linear behavior of the switch 12.

Since intermodulation distortion can depend on a phase of the envelope signal and a magnitude of the envelope signal, the phase and the magnitude can be set so as to cause intermodulation distortion to be decreased. The phase of the envelope signal can be set so as to result in a minimum intermodulation distortion. For example, the phase can be swept while the magnitude is held constant and the minimum intermodulation distortion can be identified. After the phase is set, the magnitude can be set so as to cause intermodulation distortion to be further decreased. For example, the magnitude can be swept while envelope signal has the set phase and the minimum intermodulation distortion can be identified.

A control loop can be implemented in accordance with any of the principles and advantages discussed herein to adjust phase and/or magnitude of an envelope signal and detect an indicator of linearity of a switch. The control loop can determine a phase and/or magnitude of an envelope signal that results in a desired linearity. Information associated with the phase and/or magnitude of the envelope signal that results in the desired linearity can be stored in memory and/or used to set the phase and/or magnitude of the envelope signal.

FIGS. 12A and 12B are graph of simulated intermodulation distortions of the switches according to certain embodiments. FIG. 12A is a simulation of intermodulation distortion corresponding to envelope signal injection at a gate of a field effect transistor switch. FIG. 12B is a simulation of intermodulation distortion corresponding to envelope signal injection at a body of a field effect transistor switch. The phase and magnitude of the envelope signals can be configured to cancel intermodulation distortion associated with non-linearities associated with a field effect transistor. These graphs indicate that intermodulation distortion can be canceled to reduce or substantially eliminate non-linearities associated with a field effect transistor switch with either envelope signal injection at a gate or envelope signal injection at a body.

Table 1 below includes simulation data associated with gate injection of the envelope signal and body injection of the envelope signal. Envelope generators discussed herein can adjust a phase and/or a magnitude of an envelope signal. As discussed herein, intermodulation distortion (IMD) can be reduced by setting the phase and the magnitude of the envelope signal to particular values to cancel non-linearities of a switch. The data in Table 1 indicate that there is a significant improvement in IMD using gate injection of the envelope signal and using body injection of the envelope signal. As also indicated by the data in Table 1, a phase delay can be desirable for a relatively wideband envelope signal.

TABLE 1

| Envelope Injection Simulation Data | | | | |
|---|---|---|---|---|
| | Envelope Magnitude (V) | Phase Delay of Envelope (Degrees) | Improved IMD (dBm) | Original IMD (dBm) |
| Gate Injection | 0.189 | 88 | −93 | −67 |
| Body Injection | 0.064 | 18 | −93 | −67 |

The simulations and data discussed above indicate that gate injection or body injection of an envelope signal can improve linearity of a field effect transistor switch. IMD cancellation over a relatively wide VSWR range using envelope signal injection is indicated.

FIGS. 13, 14, 15, 16, 17, and 18 are schematic diagrams of electronic systems with switching circuits according to certain embodiments. Any suitable principles and advantages of the embodiments discussed with reference to FIGS. 13 to 18 can be implemented in connection with each other and/or in connection with any other embodiments discussed herein. Electronic systems arranged to process radio frequency signals can be referred to as radio frequency systems. A radio frequency system can also process a baseband signal in some instances. Electronic systems that include a power amplifier can be referred to as power amplifier systems.

Figure 13:
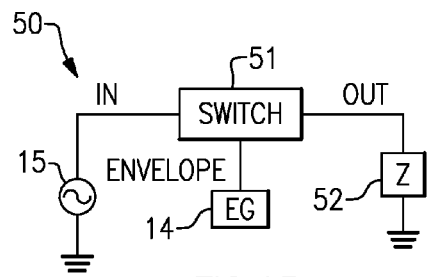
FIG. 13 is a schematic diagram of an electronic system with a switching circuit according to an embodiment.

FIG. 13 is a schematic diagram of an electronic system 50 with a switching circuit according to an embodiment. As illustrated, the electronic system 50 includes a switch 51, an envelope generator 14, an RF source 15, and a load 52.

The switch 12 discussed above is an example of the switch 51. The principles and advantages discussed herein can be applied to switches other than the switch 12 discussed above. The switch 51 can include any suitable switch configured to switch an RF signal. The switch 51 can receive an RF input signal In and selectively provide an RF output signal Out corresponding to the input signal In. The switch 51 can include a field effect transistor (e.g., like the switch 12 or the switch 61) or a bipolar transistor (e.g., like the switch 81), for example. The switch 51 can be implemented by a semiconductor-on-insulator transistor such as a silicon-on-insulator transistor, a transistor formed by a CMOS process, a pHEMT, or any other suitable device for implementing an RF switch.

The envelope generator 14 can provide an envelope signal to the switch 51 to linearize the switch 51. The envelope generator 14 can be implemented in accordance with any suitable principles and advantages of the envelope generator 21 and/or the envelope generator 31. The envelope signal can cause IMD in the output signal of the switch 51 due to non-linearities of the switch 51 to be canceled to linearize the switch 51. The envelope generator 14 can provide the envelope signal to any suitable terminal of the switch 51, such as a gate and/or a body of a field effect transistor or a base of a bipolar transistor.

The load 52 illustrates that any of the switches discussed herein can drive a load having an impedance, which can behave as a resistance or as a complex impedance that is frequency dependent.

Figure 14:
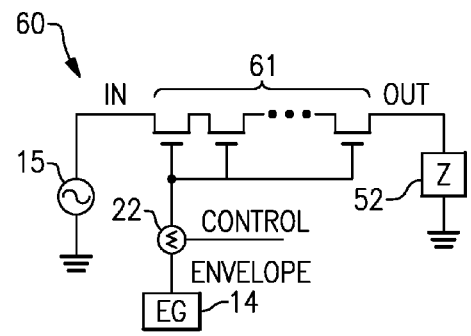
FIG. 14 is a schematic diagram of an electronic system with a switching circuit according to an embodiment in which a switch includes a plurality of field effect transistors.

FIG. 14 is a schematic diagram of an electronic system 60 with a switching circuit according to another embodiment. As illustrated, the electronic system 60 includes a switch 61, an envelope generator 14, a signal combiner 22, an RF source 15, and a load 52. FIG. 14 illustrates that a switch can include a plurality of field effect transistors arranged in series with each other from source to drain configured to receive a common signal at their gates. The field effect transistors can be metal oxide semiconductor field effect transistors. As illustrated in FIG. 14, the gates of the field effect transistors of the switch 61 are configured to receive a signal having an envelope component. This can linearize the switch 61. In some other embodiments, the envelope signal can be injected at a body of the field effect transistors of the switch 61. According to certain embodiments, a switch implemented in accordance with any of the principles and advantages discussed herein can include any suitable number of transistors in parallel and/or in series with each other.

Figure 15:
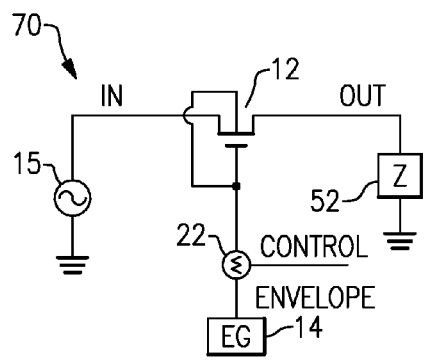
FIG. 15 is a schematic diagram of an electronic system with a switching circuit according to an embodiment with envelope injection at a gate and a body of a field effect transistor switch.

FIG. 15 is a schematic diagram of an electronic system 70 with a switching circuit according to another embodiment. As illustrated, the electronic system 70 includes a switch 12, an envelope generator 14, a signal combiner 22, an RF source 15, and a load 52. FIG. 15 illustrates that an envelope signal can be injected at a gate and a body of a field effect transistor switch 12. The envelope signal can be superimposed on a control signal by the signal combiner 22 and provided to the gate of the field effect transistor switch 12. The envelope signal can be provided at the body of the field effect transistor switch 12 without being superimposed on the control signal as shown in FIG. 15. In some other embodiments, the same signal can be provided to the gate and the body of the field effect transistor switch 12. In certain implementations, the phase and/or the magnitude of the envelope signal can be different at the body of the switch 12 and at the gate of the switch 12.

Figure 16:
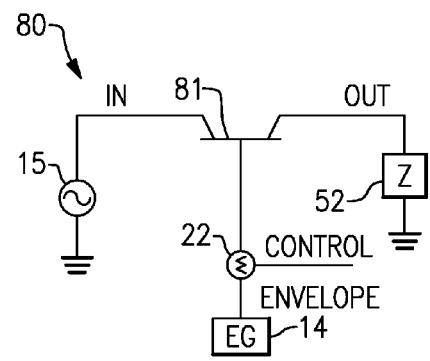
FIG. 16 is a schematic diagram of an electronic system with a switching circuit according to an embodiment in which a switch includes a bipolar transistor.

FIG. 16 is a schematic diagram of an electronic system 80 with a switching circuit according to another embodiment. As illustrated, the electronic system 80 includes a bipolar transistor switch 81, an envelope generator 14, a signal combiner 22, an RF source 15, and a load 52. FIG. 16 illustrates that a switch can be implemented by a bipolar transistor. The envelope signal can be injected at a base of the bipolar transistor switch 81. The bipolar transistor switch 81 can be implemented by any suitable bipolar transistor, such as a silicon bipolar transistor, a silicon-on-insulator bipolar transistor, a heterojunction bipolar transistor, or the like. The bipolar transistor switch 81 can be biased to function as an RF switch. The bipolar transistor switch 81 can be implemented in a relatively low cost bipolar-only process technology or other relatively low cost processes that do not include low-loss, low-distortion RF switch devices such as field effect transistors.

Figure 17:
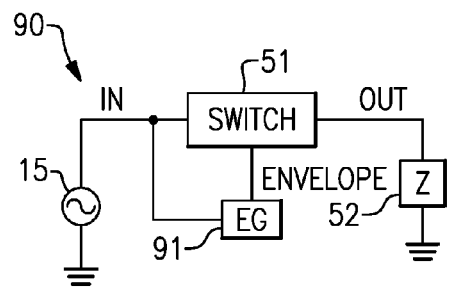
FIG. 17 is a schematic diagram of an electronic system with an envelope generator that generates an envelope signal based on an input to a switch according to an embodiment.

FIG. 17 is a schematic diagram of an electronic system 90 with a switching circuit according to another embodiment. The electronic system 90 is like the electronic system 50 of FIG. 13 except that FIG. 17 illustrates that the envelope generator 91 can receive an RF input signal In to the switch 51. The envelope generator 91 as arranged in the electronic system 90 can generate the envelope signal based on the RF input signal In. The envelope generator 91 can be implemented in accordance with any suitable principles and advantages of the envelope generator 21.

Figure 18:
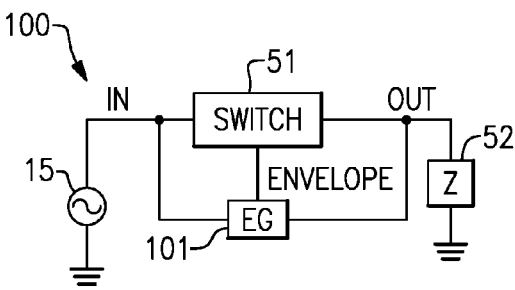
FIG. 18 is a schematic diagram of an electronic system with an envelope generator that generates an envelope signal based on an input to a switch and an output of the switch according to an embodiment.

FIG. 18 is a schematic diagram of an electronic system 100 with a switching circuit according to another embodiment. The electronic system 100 is like the electronic system 90 of FIG. 17 except that FIG. 18 illustrates that the envelope generator 101 can receive an RF input signal In to the switch 51 and the RF output signal Out provided by the switch 51. The envelope generator 101 as arranged in the electronic system 100 can generate the envelope signal based on the RF input signal In and the RF output signal Out. For instance, the envelope generator 101 as arranged in FIG. 18 can generate the envelope signal based on a voltage difference between the RF output signal Out and the RF input signal In. This can linearize the switch 51 over a wider range of impedance of the load 52, for example, in accordance with the principles and advantages discussed with reference to FIGS. 7 and 8. The envelope generator 101 can be implemented in accordance with any suitable principles and advantages of the envelope generator 31.

Figure 19:
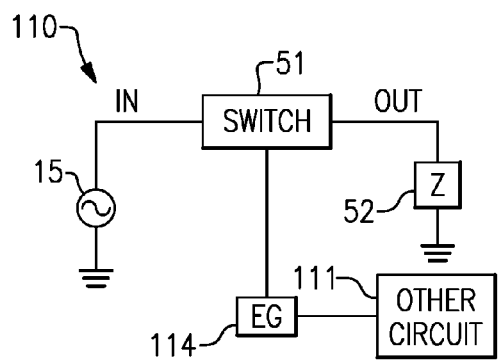
FIG. 19 is a schematic diagram of an electronic system with a switching circuit that includes envelope generator coupled to a switch and another circuit according to an embodiment.
Figure 20A:
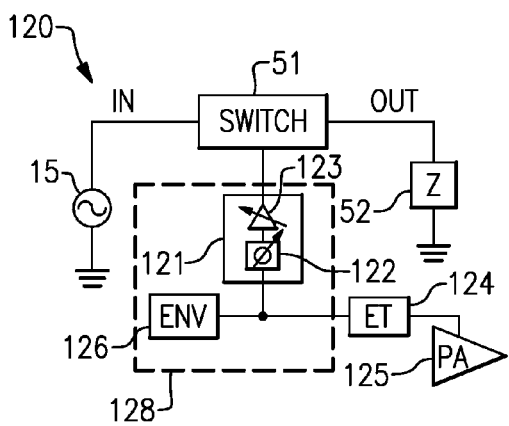
FIG. 20A is a schematic diagram of an electronic system with a switching circuit that includes envelope generator coupled to a switch and a power amplifier according to an embodiment.
Figure 20B:
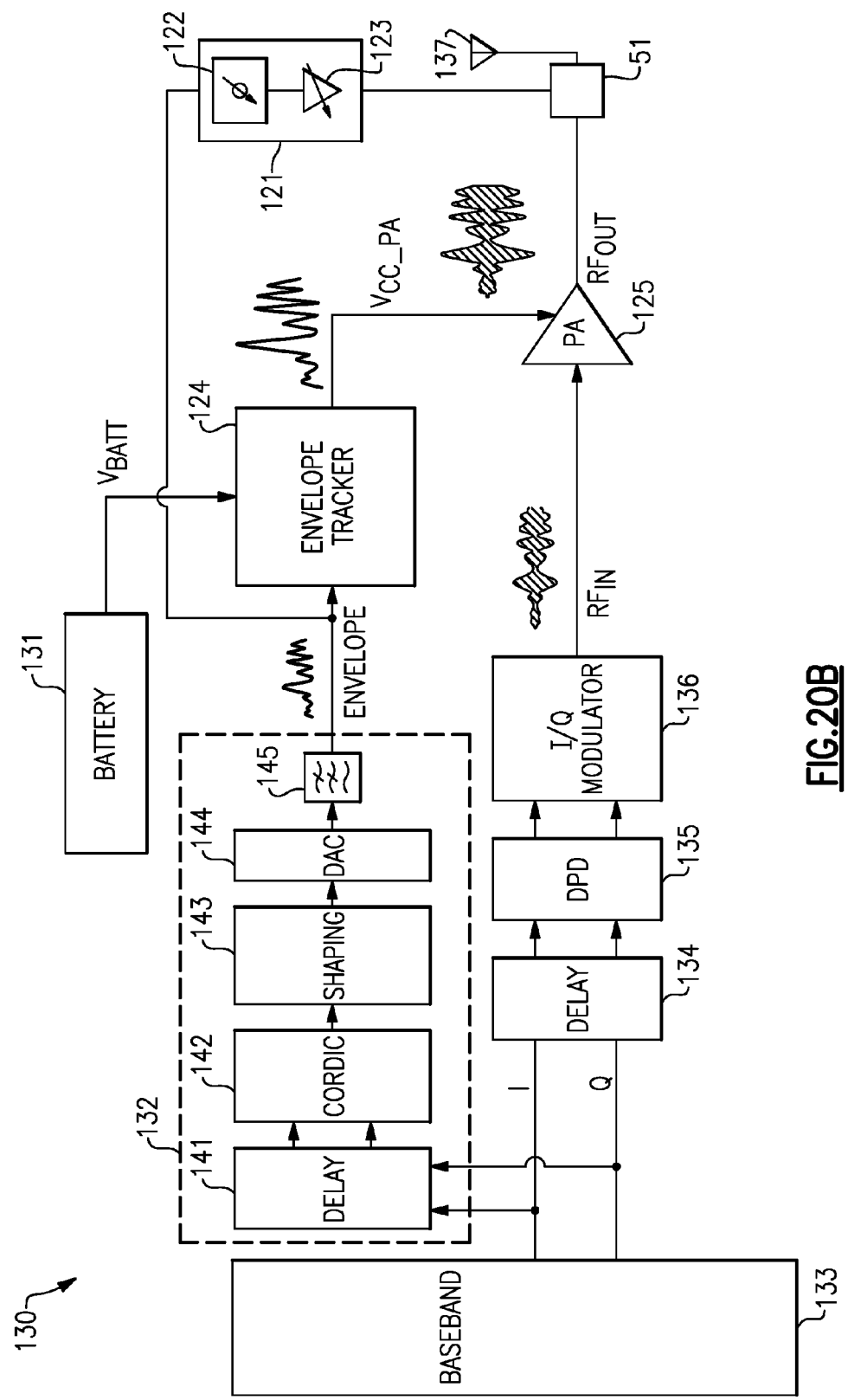
FIG. 20B is a schematic diagram of a communications system that includes envelope generator coupled to a power amplifier and a switch according to an embodiment.

FIGS. 19, 20A, and 20B are schematic diagrams of electronic systems with switching circuits that include envelope generators coupled to other circuits according to certain embodiments. Any suitable principles and advantages of the embodiments discussed with reference to FIGS. 19, 20A, and 20B can be implemented in connection with each other and/or in connection with any other embodiments discussed herein. FIGS. 19, 20A, and 20B are example implementations in which an envelope generator can generate an envelope signal for injection to a switch and for other circuitry. A shared envelope generator can advantageously save physical area and reduce costs relative to implementing more than one envelope generator.

As shown in FIG. 19, an electronic system 110 can include an envelope generator 114 coupled to the switch 51 and other circuitry 111. The envelope generator 114 can be implemented in accordance with any suitable principles and advantages of the envelope generators discussed herein. The other circuitry 111 can include any circuitry that could benefit from using an envelope signal. For instance, the other circuitry 111 can include a radio frequency component, such as another radio frequency switch. The other circuitry 111 can include an envelope tracking modulator for generating a power amplifier supply voltage.

As shown in FIG. 20A, an electronic system 120 can include an envelope generator 128 that is coupled to the switch 51 and to a power amplifier 125. An envelope tracking modulator 124 can receive an envelope signal from the envelope generator 128 and provide a supply voltage for the power amplifier 125. The envelope signal injected to the switch 51 can have a different phase and/or magnitude than the envelope signal provided to the envelope tracking modulator 124. The envelope generator 128 can include a shared envelope generating circuit 126 and an envelope processing circuit 121. The shared envelope generating circuit 126 can generate an envelope signal. The illustrated envelope processing circuit 121 can adjust the phase and the magnitude of the envelope signal. In the electronic system 120, the envelope processing circuit 121 can provide an envelope signal to the switch 51 that has a different phase and/or different magnitude than the envelope signal provided to the envelope tracking modulator 124. With such processing of the envelope signal, the shared envelope generating circuit 126 can be used for linearizing the switch 51 and for generating a power amplifier supply voltage for the power amplifier 125.

The envelope processing circuit 121 can include a phase shifter 122 and a variable magnitude element 123 to adjust the phase and/or magnitude of the envelope signal provided to the switch 51. The phase and the magnitude of the envelope signal can be implemented in accordance with any of the principles and advantages discussed herein to increase linearization of the switch 51. The phase shifter 122 can be any suitable circuit arranged to adjust the phase of the envelope signal provided by the envelope generator 128. The phase shifter 122 can be implemented by an adjustable delay element. The variable magnitude element 123 can be any suitable circuit configured to adjust the gain of the envelope signal, such as a variable gain amplifier and/or a variable attenuation attenuator. The phase shifter 122 and the variable magnitude element 123 can be in series between the envelope generator 12 and the switch 51. In some instances, the functions of the phase shifter 122 and the variable magnitude element 123 can be combined into a single element. The envelope processing circuit 121 can implement any of the features associated with phase and/or magnitude adjustment of an envelope signal discussed herein. Any of the features of the envelope processing circuit 121 can be implemented in any of the envelope generators discussed herein.

FIG. 20B is a schematic diagram of a communications system 130 that includes envelope generator coupled to a power amplifier and a switch according to an embodiment. The envelope generator can generate an envelope signal ENVELOPE from which a power amplifier supply voltage $V_{CC\_PA}$ is generated and from which an envelope signal for improving linearity of the switch 51 is also generated.

The illustrated communication system 130 includes a battery 131, an envelope generator that includes a shared envelope generating circuit 132 and an envelope processing circuit 121, an envelope tracking modulator 124, a power amplifier 125, a baseband processor 133, a signal delay circuit 134, a digital pre-distortion (DPD) circuit 135, an I/Q modulator 136, a switch 51, and an antenna 137. The shared envelope generating circuit 132 shown in FIG. 20B includes an envelope delay circuit 141, a coordinate rotation digital computation (CORDIC) circuit 142, a shaping circuit 143, a digital-to-analog converter 144, and a reconstruction filter 145. The communication system 130 of FIG. 20B illustrates an example of an RF system that can use an envelope signal to linearize a RF switch in accordance with one or more features of the present disclosure. However, the teachings herein are applicable to RF systems implemented in a wide variety of ways.

The envelope generator of FIG. 20B is an example of an envelope generator that generates an envelope signal that corresponds to an envelope of an RF signal from a baseband signal. The envelope generator of FIG. 20B is an example of using a shared envelope generating circuit 132 for generating envelope signals for different RF components.

The example shared envelope generating circuit 132 illustrated in FIG. 20B will now be described. The envelope delay circuit 141 can delay I and Q signals from the baseband processor 133. The CORDIC circuit 142 can process the delayed I and Q signals to generate a digital envelope signal representing an envelope of the RF signal $RF_{IN}$. The shaping circuit 143 can shape the digital envelope signal to enhance the performance of the communication system 130. In certain implementations, the shaping circuit 143 includes a shaping table that maps each level of the digital envelope signal to a corresponding shaped envelope signal level. Envelope shaping can aid in controlling linearity, distortion, and/or efficiency of the power amplifier 125. As illustrated, the shaped envelope signal is a digital signal that is converted by the DAC 144 to an analog envelope signal. The analog envelope signal can be filtered by the reconstruction filter 145 to generate an envelope signal suitable for use by the envelope tracking modulator 124. The reconstruction filter 125 can be a low pass filter as illustrated.

In the communications system 130, the envelope tracking modulator 124 receives the envelope signal from the reconstruction filter 145 and a battery voltage $V_{BATT}$ from the battery 131, and uses the envelope signal to generate a power amplifier supply voltage $V_{CC\_PA}$ for the power amplifier 125 that changes in relation to the envelope of the RF signal $RF_{IN}$. The power amplifier 125 receives the RF signal $RF_{IN}$ from the I/Q modulator 136, and provides an amplified RF signal $RF_{OUT}$ to the antenna 137 through the switch 51, in this example. Additional circuitry than illustrated in FIG. 20B can be included in a signal path between the power amplifier 125 and the antenna 137, such as one or more filters, one or more duplexers or other multiplexers, one or more other radio frequency switches, one or more frequency multiplexing circuits (e.g., one or more diplexers or one or more triplexers).

As shown in FIG. 20B, the envelope processing circuit 121 can adjust a phase and a magnitude of an output of the shared envelope generating circuit 132 so that the switch 51 can receive an envelope signal with a phase and magnitude to enhance linearization in accordance with any suitable principles and advantages discussed herein. The envelope processing circuit 121 can delay the output of the shared envelope generating circuit 132 as suitable for applying to the switch 51. Such a delay can account for the propagation delay of an RF signal provided to the power amplifier 125 to propagate to the switch 51 and also for setting the phase to improve linearity of the switch 51.

With continued reference to FIG. 20B, the baseband processor 133 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 136 in a digital format. The baseband processor 133 can be any suitable processor configured to process a baseband signal. For instance, the baseband processor 133 can include a digital signal processor, a microprocessor, a programmable core, the like, or any suitable combination thereof.

The signal delay circuit 134 provides adjustable delay to the I and Q signals to aid in controlling relative alignment between the envelope signal and the RF signal $RF_{IN}$. The DPD circuit 135 operates to provide digital shaping to the delayed I and Q signals from the signal delay circuit 134 to generate digitally pre-distorted I and Q signals. The DPD circuit 135 serves to reduce a distortion of the power amplifier 125 and/or to increase the efficiency of the power amplifier 125. The signal delay circuit 134 and the DPD circuit 135 can be arranged in any suitable order between the baseband processor 133 and the I/Q modulator 136.

The I/Q modulator 136 receives the digitally pre-distorted I and Q signals, which are processed to generate an RF signal $RF_{IN}$. For example, the I/Q modulator 136 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 125. In certain implementations, the I/Q modulator 136 can include one or more filters configured to filter frequency content of signals processed therein.

FIGS. 21, 22, 23, 24, 25, 26A, and 26B are schematic diagrams that illustrate applications of the switches with envelope injection according to certain embodiments. The switches discussed herein can be implemented in a variety of applications, such as any of the applications of FIG. 21, 22, 23, 24, 25, 26A, or 26B, among others.

The switches discussed herein can be implemented in a multi-throw switch. For instance, a switch arm, which can also be referred to as a series switch, of one or more throws of a multi-throw switch can be implemented by a switch with envelope injection in accordance with any of the principles and advantages discussed herein. FIG. 21 is a schematic diagram of an electronic system 150 that includes an envelope generator 14 and a multi-throw switch 151. The envelope generator 14 can provide an envelope signal to a switch arm of one or more throws of the multi-throw switch 151 to linearize the switch. The envelope generator 14 can provide envelope signals having different phases and/or magnitudes to different switch arms of a multi-throw switch, such as the multi-throw switch 151.

FIG. 22 is a schematic diagram of an electronic system 152 that includes an envelope generator 14, a power amplifier 125, and a band select switch 153. The band select switch 153 can receive an output signal from the power amplifier 125 and provide an electrical path between an output of the power amplifier 125 and processing circuitry of a selected signal path. The envelope generator 14 can provide an envelope signal to a switch arm of one or more throws of the band select switch 153 to linearize the switch.

FIG. 23 is a schematic diagram of an electronic system 154 that includes an envelope generator 14, a power amplifier 125, a low noise amplifier 155, and a transmit/receive switch 156. The transmit/receive switch 156 can electrically connect the power amplifier 125 to a node in a transmit mode and electrically connect the low noise amplifier 155 to the node in a receive mode. The envelope generator 14 can provide an envelope signal to a switch arm of one or more throws of the transmit/receive switch 155 to linearize the switch.

FIG. 24 is a schematic diagram of an electronic system 160 that includes an envelope generator 14, a power amplifier 125, a processing circuit 161, and an antenna switch 162. The processing circuit 161 is coupled to an output of the power amplifier 125. The processing circuit 161 can provide impedance matching, filtering, and/or other processing. The antenna switch 162 can electrically connect a selected signal path, such as the signal path that includes the power amplifier 125 and the processing circuit 161, to an antenna port. The envelope generator 14 can provide an envelope signal to a switch arm of one or more throws of the antenna switch 162 to linearize the switch.

FIG. 25 is a schematic diagram of an electronic system 170 that includes an envelope generator 114, a power amplifier 125, an RF switch 171 (e.g., a band select switch or a transmit/receive switch), a processing circuit 161, and an antenna switch 162. FIG. 25 illustrates that more than one switch in a signal path can be linearized with envelope injection. FIG. 25 also illustrates that a common envelope generator 114 can be shared by two or more switches in the signal path. The envelope generator 114 of FIG. 25 can provide envelope signals having different phases and/or magnitudes to different respective switches.

Figure 26A:
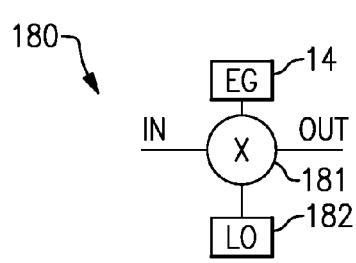
FIG. 26A is a schematic diagram of an electronic system that includes an envelope injection in a mixer according to an embodiment.
Figure 26B:
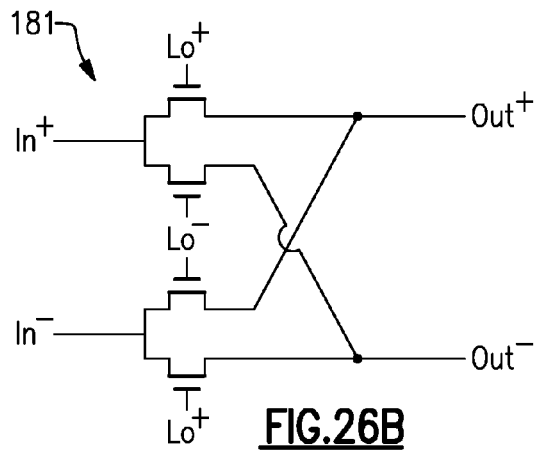
FIG. 26B is a schematic diagram of an example of the mixer of FIG. 26A.

FIG. 26A is a schematic diagram of an electronic system 180 that includes an envelope generator 14, a mixer 181, and a local oscillator 182. The envelope generator 14 of FIG. 26A can provide an envelope signal to one or more switches of the mixer 181 to linearize the switches. FIG. 26B shows an illustrative mixer 181 with switches 183, 184, 185, and 186. Any of these switches can be linearized with envelope injection in accordance with the principles and advantages discussed herein. For instance, an envelope signal can be injected at a gate and/or a body of any of the field effect transistors illustrated in FIG. 26B.

Figure 27:
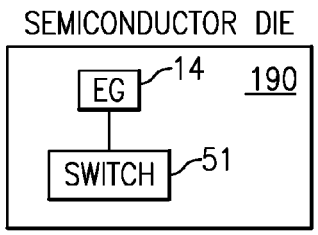
FIG. 27 illustrates a semiconductor die that includes an envelope generator and a RF switch according to an embodiment.
Figure 28:
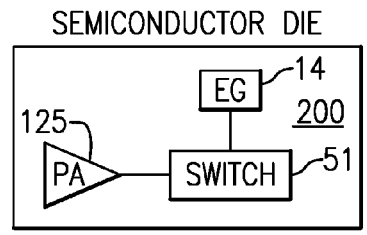
FIG. 28 illustrates a semiconductor die that includes an envelope generator, a RF switch, and a power amplifier according to an embodiment.

FIGS. 27 and 28 illustrate semiconductor die that include switches with envelope injection according to certain embodiments. Some or all of the circuit elements of the switching circuits discussed above can be implemented on a single semiconductor die. The semiconductor die can be manufactured using any suitable process technology. As one example, the die can be a semiconductor-on-insulator die, such as a silicon-on-insulator die. According to some other embodiments, the semiconductor die can be a CMOS die, a gallium arsenide die, a silicon germanium die, or the like. As illustrated in FIG. 27, the envelope generator 14 and the switch 51 can be implemented on a common semiconductor die 190. As illustrated in FIG. 28, the envelope generator 14, the switch 51, and the power amplifier 125 can be implemented on a common semiconductor die 200.

Figure 29:
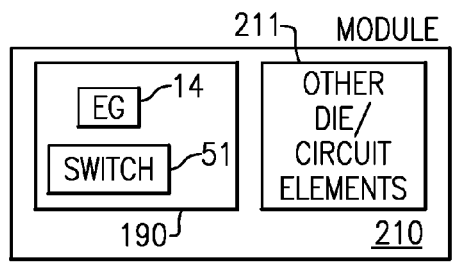
FIG. 29 illustrates a packaged module that includes a switch with envelope injection according to an embodiment.
Figure 30:
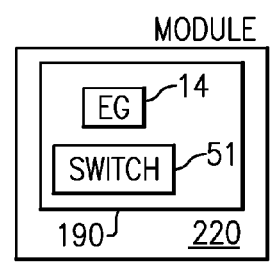
FIG. 30 illustrates a packaged module that includes a switch with envelope injection according to another embodiment.
Figure 31:
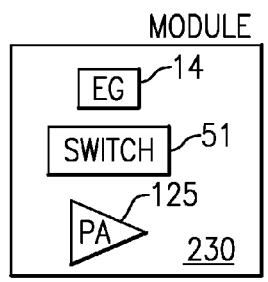
FIG. 31 illustrates a packaged module that includes a switch with envelope injection according to another embodiment.

FIGS. 29, 30, and 31 illustrate packaged modules that include switches with envelope injection according to certain embodiments. Packaged modules can include a packaging substrate, such as a relatively low cost laminate substrate. Packaged modules that process RF signals can be referred to as RF modules. A packaged module can include a switching circuit in accordance with any suitable principles and advantages discussed herein. A packaged module can include any suitable electronic system and/or semiconductor die discussed herein enclosed within a package. Some such packaged modules can be multi-chip modules. The packaged modules include a package enclosing the illustrated circuit elements. FIG. 29 illustrates a packaged module 210 that includes the semiconductor die 190 of FIG. 27 and another die and/or other circuit elements 211. FIG. 30 illustrates a packaged module 220 that includes the envelope generator 14 and the switch 51. FIG. 31 illustrates a packaged module 230 that includes the envelope generator 14, the switch 51, and the power amplifier 125.

Figure 32:
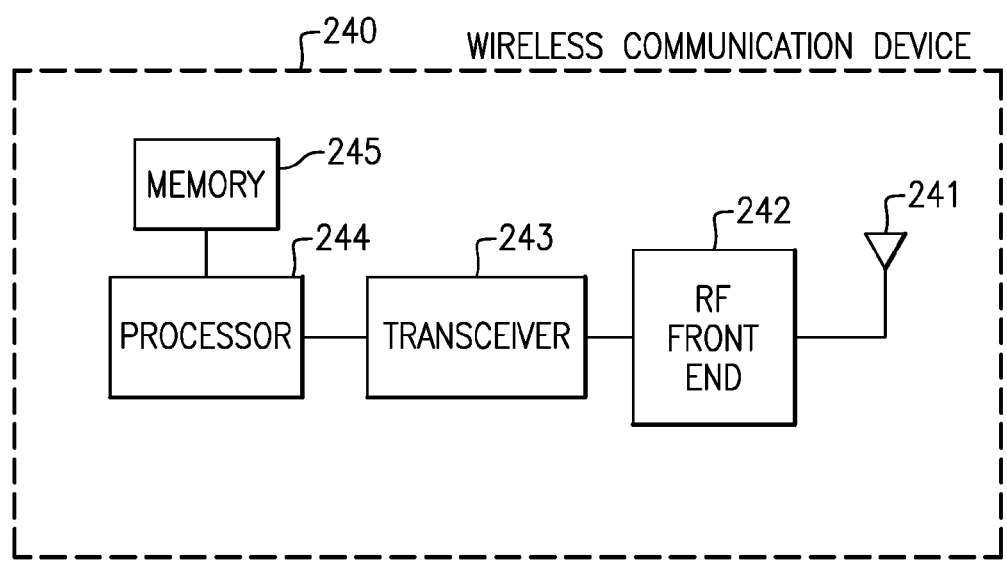
FIG. 32 illustrates a wireless communication device that includes a switch with envelope injection according to an embodiment.

FIG. 32 illustrates a wireless communication device 240 that includes a switch with envelope injection in accordance with one or more embodiments. The wireless communication device 240 can be any suitable wireless communication device. For instance, the wireless communication device 240 can be a mobile phone, such as a smart phone. As illustrated, the wireless communication device 240 includes a first antenna 241, an RF front end system 242, a transceiver 243, a processor 244, and a memory 245. Any of the switches with envelope injection discussed herein can be implemented in the RF front end system 242. A front end system can include circuits in signal path(s) between one or more antennas and a baseband system. Some front end systems include circuits in a signal path between one or more antennas and a mixer configured to modulate a signal to RF or to demodulate an RF signal. Front end systems can process RF signals. Accordingly, front end systems can be referred to as RF front end systems. The RF front end system 242 can provide an RF signal to the antenna 241 for transmission and/or process an RF signal received by way of the antenna 241. The memory 245 can store data on the wireless communication device 240. The processor 244 can store and/or access data in the memory 244. The processor 244 can process baseband signals and can be in communication with the RF front end system 242.

Any of the principles and advantages discussed herein can be applied to other systems, not just to the systems described above. The elements and operations of the various embodiments described above can be combined to provide further embodiments. Some of the embodiments described above have provided examples in connection with particular switches, power amplifier, front end modules and/or wireless communications devices. However, the principles and advantages of the embodiments can be used in connection with any other systems, apparatus, or methods that benefit could from any of the teachings herein. For instance, any of the principles and advantages discussed herein can be implemented in connection with any switch that could benefit from enhanced linearization. Any of the principles and advantages discussed herein can be implemented in an RF switch configured to receive an RF signal having a frequency in in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, wireless communication devices, personal area network communication devices, cellular communications infrastructure such as a base station, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, a peripheral device, a clock, etc. Further, the electronic devices can include unfinished products.

Unless the context requires otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other or coupled by way of one or more intermediate elements. Likewise, the word "connected," as generally used herein, refers to two or more elements that may be either directly connected or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A switching circuit with enhanced linearity, the switching circuit comprising:
    a switch configured to receive an input signal, to provide an output signal, and to receive an envelope signal corresponding to an envelope of the input signal, the input signal including a first tone at a first frequency and a second tone at a second frequency, and the envelope signal having a frequency corresponding to a difference between the first frequency and the second frequency; and
    an envelope generator configured to generate the envelope signal so as to cause intermodulation distortion in the output signal to be reduced, the envelope generator being configured to adjust a phase of the envelope signal.

2. The switching circuit of claim 1 wherein the switch includes a field effect transistor having a body configured to receive the envelope signal.

3. The switching circuit of claim 1 wherein the switch is configured to receive the envelope signal at a control terminal.

4. The switching circuit of claim 3 wherein the envelope signal is superimposed on a direct current control signal at the control terminal, the switch configured to turn on and to turn off in response to the direct current control signal.

5. The switching circuit of claim 1 wherein the envelope generator is configured to adjust the phase of the envelope signal such that intermodulation associated with mixing of the envelope signal and the input signal has substantially an opposite phase as intermodulation due to non-linear behavior of the switch.

6. The switching circuit of claim 1 wherein the envelope generator is configured to adjust a magnitude of the envelope signal.

7. The switching circuit of claim 1 wherein the envelope generator is coupled to an envelope tracking modulator configured to provide a power amplifier supply voltage to a power amplifier.

8. The switching circuit of claim 1 wherein the input signal is a radio frequency signal and the switch is a radio frequency switch.

9. The switching circuit of claim 1 wherein the envelope generator is configured to receive the input signal and to generate the envelope signal based on the input signal.

10. The switching circuit of claim 1 wherein the envelope generator is configured to receive the input signal and the output signal and to generate the envelope signal based on the input signal and the output signal.

11. A radio frequency system comprising:
a radio frequency source configured to provide a radio frequency signal, the radio frequency signal including a first tone at a first frequency and a second tone at a second frequency;
a switch configured to pass the radio frequency signal; and
an envelope generator configured to generate an envelope signal corresponding to an envelope of the radio frequency signal and to apply the envelope signal to the switch to cause intermodulation distortion to be reduced, the envelope signal having a frequency corresponding to a difference between the first frequency and the second frequency, and the envelope generator being configured to adjust a phase of the envelope signal.

12. The radio frequency system of claim 11 wherein the envelope generator is configured to adjust a magnitude of the envelope signal.

13. The radio frequency system of claim 11 wherein the switch includes a field effect transistor having a body and the envelope generator is configured to apply the envelope signal to the body.

14. The radio frequency system of claim 11 wherein the switch includes a field effect transistor having a gate configured to receive the envelope signal superimposed on a control signal.

15. The radio frequency system of claim 11 wherein the radio frequency source includes a power amplifier.

16. The radio frequency system of claim 15 wherein the switch is included in an antenna switch, a band select switch, or a transmit/receive switch.

17. A method of switching a radio frequency signal with improved linearity, the method comprising:
generating an envelope signal with an envelope generator, the envelope generator configured to adjust a phase of the envelope signal;
providing the envelope signal to a radio frequency switch; and
passing a radio frequency signal using the radio frequency switch while the radio frequency switch receives the envelope signal such that the envelope signal reduces intermodulation distortion associated with the radio frequency switch, the radio frequency signal including a first tone at a first frequency and a second tone at a second frequency, and the envelope signal having a frequency corresponding to a difference between the first frequency and the second frequency.

18. The method of claim 17 further comprising setting the phase and a magnitude of the envelope signal.

19. The method of claim 17 wherein the radio frequency switch includes a field effect transistor and the providing includes applying the envelope signal to a body of the field effect transistor.

20. The method of claim 17 wherein the radio frequency switch includes a field effect transistor and the providing includes applying the envelope signal to a gate of the field effect transistor.

* * * * *